United States Patent
Kang et al.

(10) Patent No.: US 10,135,400 B2
(45) Date of Patent: Nov. 20, 2018

(54) METHOD AND APPARATUS FOR IMPROVING SIGNAL QUALITY IN ELECTRONIC DEVICE

(71) Applicant: Samsung Electronics Co., Ltd., Suwon-si, Gyeonggi-do (KR)

(72) Inventors: Minsoo Kang, Suwon-si (KR); Jaeyoung Jang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/453,261

(22) Filed: Mar. 8, 2017

(65) Prior Publication Data

US 2017/0294883 A1 Oct. 12, 2017

(30) Foreign Application Priority Data

Apr. 6, 2016 (KR) .................. 10-2016-0042357

(51) Int. Cl.
| | |
|---|---|
| *H03F 1/26* | (2006.01) |
| *H03F 1/56* | (2006.01) |
| *H03F 3/24* | (2006.01) |
| *H03F 3/19* | (2006.01) |
| *H04W 4/00* | (2018.01) |
| *H04W 52/24* | (2009.01) |
| *H04B 17/336* | (2015.01) |

(52) U.S. Cl.
CPC ............ *H03F 1/26* (2013.01); *H03F 1/56* (2013.01); *H03F 3/19* (2013.01); *H03F 3/245* (2013.01); *H04B 17/336* (2015.01); *H04W 4/00* (2013.01); *H04W 52/243* (2013.01); *H03F 2200/105* (2013.01); *H03F 2200/387* (2013.01); *H03F 2200/451* (2013.01); *H03F 2200/465* (2013.01)

(58) Field of Classification Search
CPC ........................................................ H03F 1/26
USPC ........................................................ 330/127
See application file for complete search history.

(56) References Cited

U.S. PATENT DOCUMENTS

| | | | | |
|---|---|---|---|---|
| 4,380,824 A | * | 4/1983 | Inoue | H03G 3/32 381/86 |
| 4,553,257 A | * | 11/1985 | Mori | H03G 3/32 381/107 |
| 4,644,292 A | * | 2/1987 | Kunugi | H03G 5/18 330/149 |
| 4,674,121 A | * | 6/1987 | Miura | H04B 1/1661 381/10 |
| 4,864,246 A | * | 9/1989 | Kato | H03G 3/32 330/129 |

(Continued)

FOREIGN PATENT DOCUMENTS

KR 10-2014-0071144 A 6/2014

*Primary Examiner* — Patricia T Nguyen
(74) *Attorney, Agent, or Firm* — Jefferson IP Law, LLP

(57) ABSTRACT

A method and an apparatus for improving signal quality through noise detection in an electronic device are provided. The electronic device may include a power amplifier configured to amplify and output a transmitted signal, a noise detector configured to detect noise in a receiving band by the power amplifier and to output a power level of the detected noise, and a processor configured to acquire the power level of the noise through the noise detector, acquire control information to change the output power of the power amplifier based on the power level of the noise, and control the output power of the power amplifier based on the control information.

17 Claims, 15 Drawing Sheets

(56) References Cited

U.S. PATENT DOCUMENTS

| | | | | |
|---|---|---|---|---|
| 5,450,494 A * | 9/1995 | Okubo | ............... | H03G 3/32 |
| | | | | 348/E5.122 |
| 5,734,987 A * | 3/1998 | Shiono | ............... | H04B 3/20 |
| | | | | 379/392.01 |
| 7,103,188 B1 * | 9/2006 | Jones | ............... | G10K 11/178 |
| | | | | 381/71.13 |
| 2005/0208899 A1 * | 9/2005 | Hanabusa | ......... | H04W 52/0283 |
| | | | | 455/69 |

* cited by examiner

METHOD AND APPARATUS FOR IMPROVING SIGNAL QUALITY IN ELECTRONIC DEVICE

CROSS-REFERENCE TO RELATED APPLICATION(S)

This application claims the benefit under 35 U.S.C. § 119(a) of a Korean patent application filed on Apr. 6, 2016 in the Korean Intellectual Property Office and assigned Serial number 10-2016-0042357, the entire disclosure of which is hereby incorporated by reference.

TECHNICAL FIELD

The present disclosure relates to a method and an apparatus for improving signal quality through noise detection in an electronic device.

BACKGROUND

Recently, various types of electronic devices, such as a mobile communication terminal, a smartphone, a tablet personal computer (PC), a notebook, a wearable device, a digital camera, and a personal computer, have been widely used with the development of digital technologies.

An electronic device may simultaneously transmit and receive data for full-duplex communications in a full-duplex communication system. For example, the electronic device may transmit a transmitted (Tx) signal to a base station through a duplexer and an antenna, and may receive a received (Rx) signal through the antenna and the duplexer.

In the electronic device, a transmitted signal path for signal transmission and a received signal path for signal reception may be simultaneously active, and the received signal path may receive interference by the transmitted signal path. For example, some Tx signals (for example, Tx noise) may infiltrate into the received signal path from the duplexer, and this Tx noise may cause deterioration in the performance of the received signal path.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an apparatus and a method which are capable of detecting the occurrence of desense of a receiving circuit in an electronic device.

Another aspect of the present disclosure is to provide an apparatus and a method which are capable of detecting noise of a receiving circuit in an electronic device and controlling an output from a power amplifier corresponding to the power level of the detected noise.

Another aspect of the present disclosure is to provide an apparatus and a method which are capable of controlling an output from a power amplifier corresponding to noise of a receiving circuit to eliminate noise by the power amplifier, thereby improving signal quality.

In accordance with an aspect of the present disclosure, an electronic device is provided. The electronic device includes a power amplifier configured to amplify and output a transmitted signal, a noise detector configured to detect noise in a receiving band by the power amplifier and to output a power level of the detected noise, and a processor, wherein the processor may be configured to acquire the power level of the noise through the noise detector, acquire control information to change output power of the power amplifier based on the power level of the noise, and control the output power of the power amplifier based on the control information.

In accordance with another aspect of the present disclosure, an operating method of an electronic device is provided. The operating method includes detecting noise in a receiving band by a power amplifier, acquiring a power level of the noise, acquiring control information to change output power of the power amplifier based on the power level of the noise, and controlling the output power of the power amplifier based on the control information.

To achieve the foregoing aspects, various embodiments of the present disclosure may include a computer-readable recording medium that records a program for a processor to implement the method.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
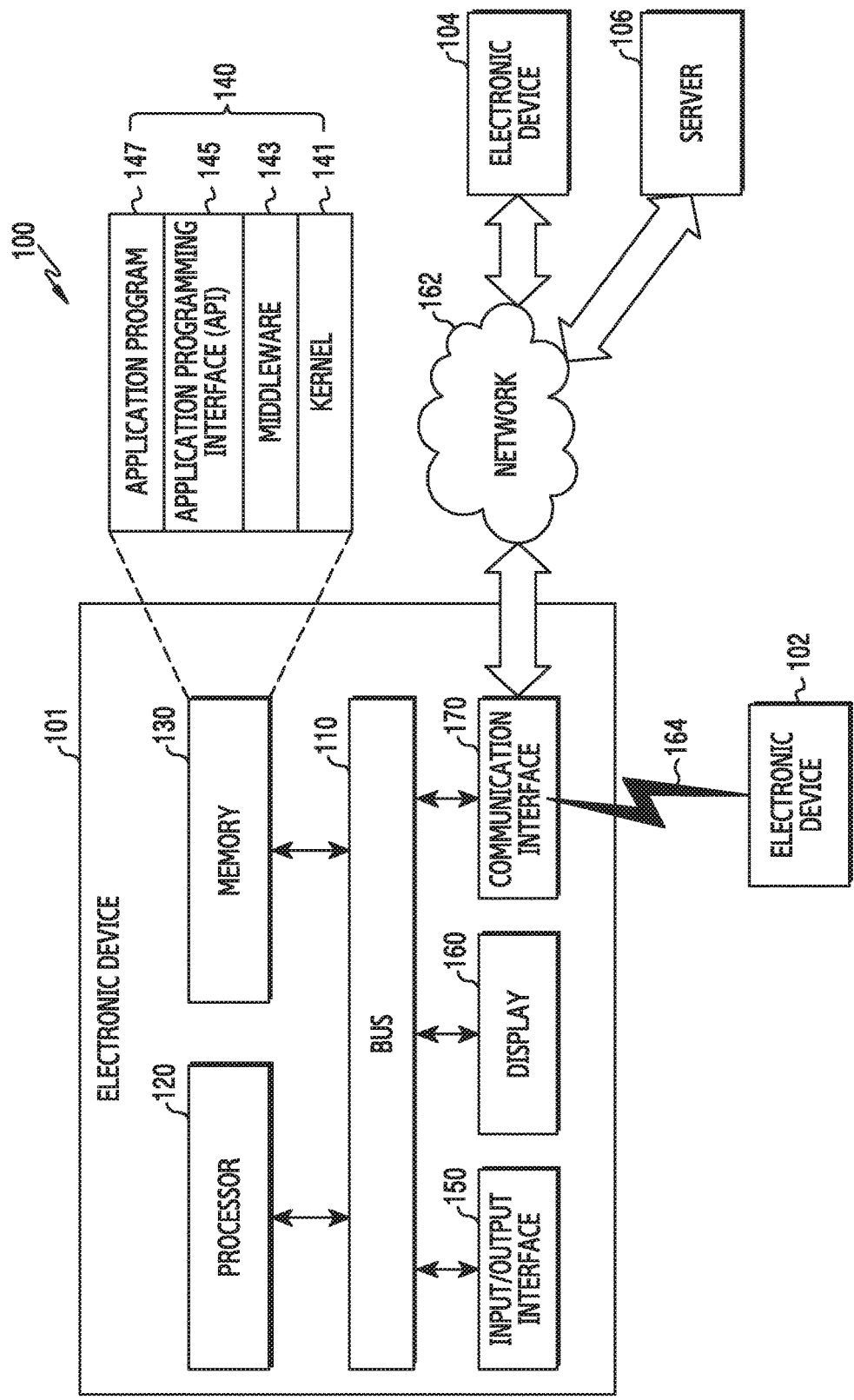
FIG. 1 illustrates a network environment including an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposed between them. In contrast, it may be understood that when an element (e.g., first element) is referred to as being "directly connected," or "directly coupled" to another element (second element), there are no element (e.g., third element) interposed between them.

The expression "configured to" used in the present disclosure may be used interchangeably with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may refer to a situation in which that the device, together with other devices or components, "is able to". For example, the phrase "processor adapted (or configured) to perform A, B, and C" may refer, for example, to a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even where the term is defined in the present disclosure, it should not be interpreted to exclude embodiments of the present disclosure.

An electronic device according to various embodiments of the present disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a Moving Picture Experts Group phase 1 or phase 2 (MPEG-1 or MPEG-2) audio layer-3 (MP3) player, a mobile medical device, a camera, and a wearable device, or the like, but is not limited thereto. According to various embodiments, the wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit), or the like, but is not limited thereto.

According to some embodiments, the electronic device may be a home appliance. The home appliance may include at least one of, for example, a television (TV), a digital versatile disc (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame, or the like, but is not limited thereto.

According to an embodiment, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.), or the like, but is not limited thereto.

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter), or the like, but is not limited thereto. The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology.

Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

FIG. 1 illustrates a network environment including an electronic device according to various embodiments of the present disclosure.

An electronic device 101 within a network environment 100, according to various embodiments, will be described with reference to FIG. 1. The electronic device 101 may include a bus 110, a processor 120, a memory 130, an input/output interface 150, a display 160, and a communication interface 170. According to an embodiment of the present disclosure, the electronic device 101 may omit at least one of the above components or may further include other components.

The bus 110 may include, for example, a circuit which interconnects the components 110 to 170 and delivers a communication (e.g., a control message and/or data) between the components 110 to 170.

The processor 120 may include one or more of a CPU, an AP, and a communication processor (CP). The processor 120 may carry out, for example, calculation or data processing relating to control and/or communication of at least one other component of the electronic device 101. An operation of processing (or controlling) the processor 120 according to various embodiments will be described below in detail with reference to the accompanying drawings.

The memory 130 may include a volatile memory and/or a non-volatile memory. The memory 130 may store, for example, commands or data relevant to at least one other component of the electronic device 101. According to an embodiment of the present disclosure, the memory 130 may store software and/or a program 140. The program 140 may include, for example, a kernel 141, middleware 143, an application programming interface (API) 145, and/or application programs (or "applications") 147. At least some of the kernel 141, the middleware 143, and the API 145 may be referred to as an operating system (OS).

The memory 130 may store one or more programs that are executed by the processor 120, and may perform a function of temporarily storing the input/output data. The memory 130 may play the role of storing obtained data. The data, which is obtained in real time, may be stored in a temporary storage device, and the data, which is determined to be stored, may be stored in a permanent storage device. The memory 130 may include a computer readable recording medium having a program recorded thereon to execute the method according to various embodiments in the processor 120. The memory 130 may store control information (e.g., a bias, a power control value, etc.) related to power control of the power amplifier. The control information may include a plurality of control information corresponding to a plurality of power levels.

The kernel 141 may control or manage system resources (e.g., the bus 110, the processor 120, or the memory 130) used for performing an operation or function implemented in the other programs (e.g., the middleware 143, the API 145, or the application programs 147). Furthermore, the kernel 141 may provide an interface through which the middleware 143, the API 145, or the application programs 147 may access the individual components of the electronic device 101 to control or manage the system resources.

The middleware 143, for example, may serve as an intermediary for allowing the API 145 or the application programs 147 to communicate with the kernel 141 to exchange data.

Also, the middleware 143 may process one or more task requests received from the application programs 147 according to priorities thereof. For example, the middleware 143 may assign priorities for using the system resources (e.g., the bus 110, the processor 120, the memory 130, or the like) of the electronic device 101, to at least one of the application programs 147. For example, the middleware 143 may perform scheduling or loading balancing on the one or more task requests by processing the one or more task requests according to the priorities assigned thereto.

The API 145 is an interface through which the applications 147 control functions provided from the kernel 141 or the middleware 143, and may include, for example, at least one interface or function (e.g., instruction) for file control, window control, image processing, character control, and the like.

The input/output interface 150, for example, may function as an interface that may transfer commands or data input from a user or another external device to the other element(s) of the electronic device 101. Furthermore, the input/output interface 150 may output the commands or data received from the other element(s) of the electronic device 101 to the user or another external device.

Examples of the display 160 may include a liquid crystal display (LCD), a light-emitting diode (LED) display, an organic LED (OLED) display, a microelectromechanical systems (MEMS) display, and an electronic paper display, or the like, but is not limited thereto. The display 160 may display, for example, various types of contents (e.g., text, images, videos, icons, or symbols) to users. The display 160 may include a touch screen, and may receive, for example, a touch, gesture, proximity, or hovering input using an electronic pen or a user's body part.

The communication interface 170 may establish communication, for example, between the electronic device 101 and an external device (e.g., a first external electronic device 102, a second external electronic device 104, or a server 106). For example, the communication interface 170 may be connected to a network 162 through wireless or wired communication, and may communicate with an external device (e.g., the second external electronic device 104 or the server 106).

The wireless communication may use at least one of, for example, long term evolution (LTE), LTE-advanced (LTE-A), code division multiple access (CDMA), wideband CDMA (WCDMA), universal mobile telecommunications system (UMTS), wireless broadband (WiBro), and global system for mobile communications (GSM), as a cellular communication protocol. In addition, the wireless communication may include, for example, short range communication 164. The short-range communication 164 may include at least one of, for example, Wi-Fi, Bluetooth (BT), near field communication (NFC), and global navigation satellite system (GNSS). GNSS may include, for example, at least one of global positioning system (GPS), global navigation satellite system (GLONASS), BeiDou Navigation satellite system (BeiDou) or Galileo, and the European global satellite-based navigation system, based on a location, a bandwidth, or the like. Hereinafter, in the present disclosure, the "GPS" may be interchangeably used with the "GNSS". The wired communication may include, for example, at least one of a universal serial bus (USB), a high definition multimedia interface (HDMI), recommended standard 232 (RS-232), and a plain old telephone service (POTS).

The network 162 may include at least one of a telecommunication network such as a computer network (e.g., a local area network (LAN) or a wide area network (WAN)), the internet, and a telephone network.

Each of the first and second external electronic devices 102 and 104 may be of a type identical to or different from that of the electronic device 101. According to an embodiment of the present disclosure, the server 106 may include a group of one or more servers.

According to various embodiments of the present disclosure, all or some of the operations performed in the electronic device 101 may be executed in another electronic device or a plurality of electronic devices (e.g., the electronic devices 102 and 104 or the server 106). According to an embodiment of the present disclosure, when the electronic device 101 has to perform some functions or services automatically or in response to a request, the electronic device 101 may request another device (e.g., the electronic device 102 or 104 or the server 106) to execute at least some functions relating thereto instead of or in addition to autonomously performing the functions or services. Another electronic device (e.g., the electronic device 102 or 104, or the server 106) may execute the requested functions or the additional functions, and may deliver a result of the execution to the electronic device 101. The electronic device 101 may process the received result as it is or additionally, and may provide the requested functions or services. To this end, for example, cloud computing, distributed computing, or client-server computing technologies may be used.

The server 106 may include, for example, at least one of a certification server, an integration server, a provider server (or a mobile network operator server), a content server, an internet server, or a cloud server.

Figure 2:
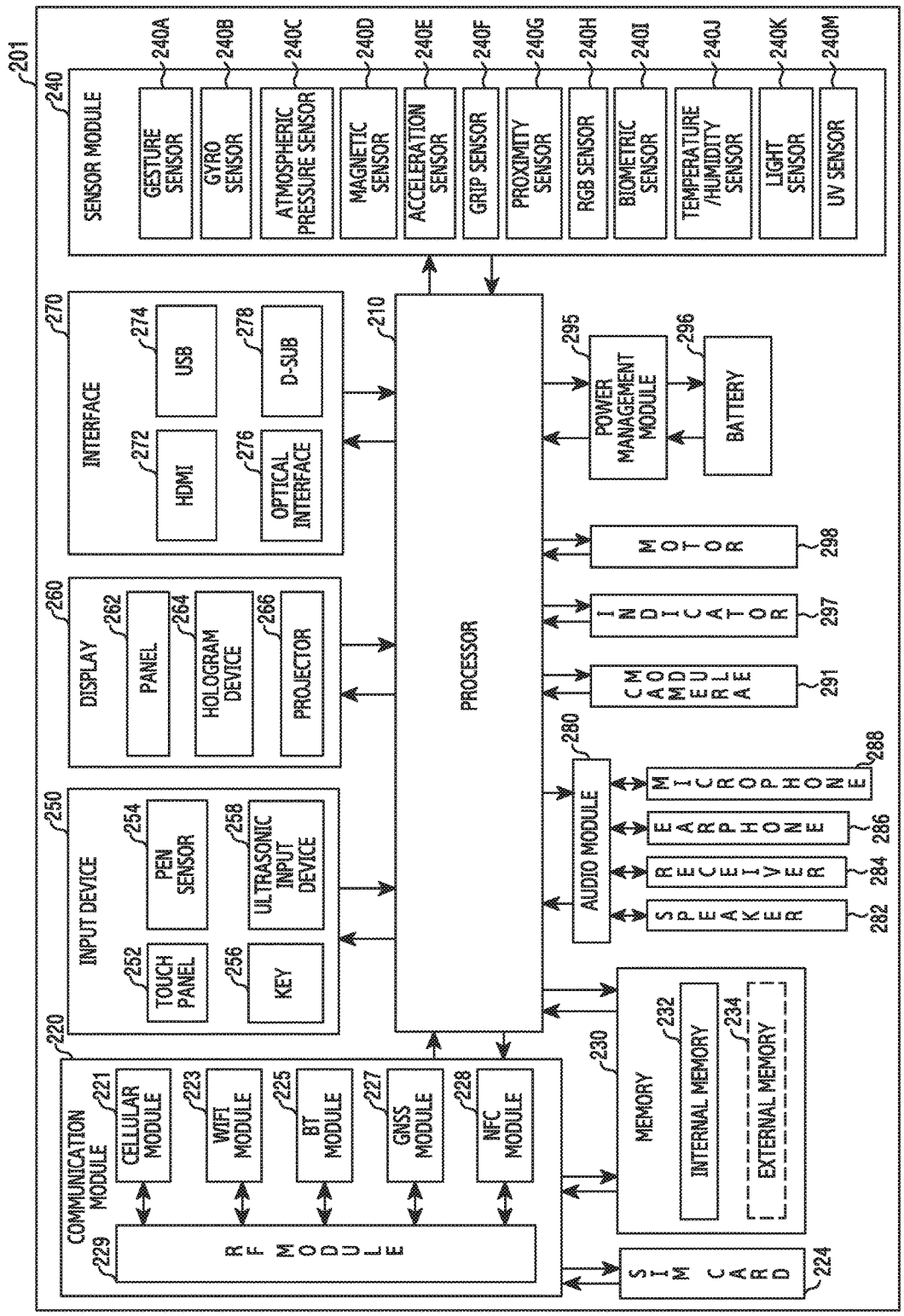
FIG. 2 is a block diagram of an electronic device according to various embodiments of the present disclosure.

FIG. 2 is a block diagram of an electronic device according to various embodiments of the present disclosure.

Referring to FIG. 2, the electronic device 201 may include, for example, all or a part of the electronic device 101 shown in FIG. 1. The electronic device 201 may include one or more processors 210 (e.g., APs), a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298.

The processor 210 may control a plurality of hardware or software components connected to the processor 210 by driving an operating system or an application program, and perform processing of various pieces of data and calculations. The processor 210 may be embodied as, for example, a system on chip (SoC). According to an embodiment of the present disclosure, the processor 210 may further include a graphics processing unit (GPU) and/or an image signal processor. The processor 210 may include at least some (for example, a cellular module 221) of the components illustrated in FIG. 2. The processor 210 may load, into a volatile memory, commands or data received from at least one (e.g., a non-volatile memory) of the other components and may process the loaded commands or data, and may store various data in a non-volatile memory.

The communication module 220 may have a configuration equal or similar to that of the communication interface 170 of FIG. 1. The communication module 220 may include, for example, a cellular module 221, a Wi-Fi module 223, a BT module 225, a GNSS module 227 (e.g., a GPS module 227, a GLONASS module, a BeiDou module, or a Galileo module), an NFC module 228, and a radio frequency (RF) module 229.

The cellular module 221, for example, may provide a voice call, a video call, a text message service, or an internet service through a communication network. According to an embodiment of the present disclosure, the cellular module 221 may distinguish and authenticate the electronic device 201 in a communication network using the SIM 224 (for example, the SIM card). According to an embodiment of the present disclosure, the cellular module 221 may perform at least some of the functions that the AP 210 may provide. According to an embodiment of the present disclosure, the cellular module 221 may include a CP.

For example, each of the Wi-Fi module 223, the BT module 225, the GNSS module 227, and the NFC module 228 may include a processor for processing data transmitted/received through a corresponding module. According to an embodiment of the present disclosure, at least some (e.g., two or more) of the cellular module 221, the Wi-Fi module 223, the BT module 225, the GNSS module 227, and the NFC module 228 may be included in one integrated chip (IC) or IC package.

The RF module 229, for example, may transmit/receive a communication signal (e.g., an RF signal). The RF module 229 may include, for example, a transceiver, a power amplifier module (PAM), a frequency filter, a low noise amplifier (LNA), and an antenna. According to another embodiment of the present disclosure, at least one of the cellular module 221, the Wi-Fi module 223, the BT module 225, the GNSS module 227, and the NFC module 228 may transmit/receive an RF signal through a separate RF module.

The WIFI module 223 may refer to a module for wireless Internet access and for forming wireless LAN links with external electronic devices (e.g., the other electronic device 102, or the server 106). The Wi-Fi module 223 may be provided inside, or outside, the electronic device 201. The wireless internet technology may use Wi-Fi, WiBro, world interoperability for microwave access (WiMax), high speed downlink packet access (HSDPA), or millimeter wave (mm-Wave). The Wi-Fi module 223 may interwork with external electronic devices (e.g., the other electronic device 104), which are connected with the electronic device 201 through a network (e.g., a wireless Internet network) (e.g., the network 162) in order to thereby transmit a variety of data of the electronic device 201 to the outside, or in order to thereby receive data from the outside. The Wi-Fi module 223 may always remain in the on state, or may be turned on/off according to the configuration of the electronic device 400 or a user input.

The BT module 225 and the NFC module 228 may refer to a module for performing the short-range communication. The short-range communication technology may use BT, BT low energy (BLE), RF identification (RFID), infrared data association (IrDA), ultra wideband (UWB), ZigBee, near-field magnetic induction (NFMI), or NFC. The BT module 225 and the NFC module 228 may interwork with the external electronic devices (e.g., the other electronic device 102), which are connected with the electronic device 201 through a network (e.g., a short-range communication network) in order to thereby transmit a variety of data of the electronic device 201 to the external electronic devices, or in order to thereby receive data from the same. The BT module 225 and the NFC module 228 may always remain in the on state, or may be turned on/off according to the configuration of the electronic device 400 or a user input.

The subscriber identification module 224 may include, for example, a card including a subscriber identity module and/or an embedded SIM, and may contain unique identification information (e.g., an integrated circuit card identifier (ICCID)) or subscriber information (e.g., an international mobile subscriber identity (IMSI)).

The memory 230 (e.g., the memory 130) may include, for example, an embedded memory 232 and/or an external memory 234. The embedded memory 232 may include at least one of a volatile memory (e.g., a dynamic random access memory (DRAM), a static RAM (SRAM), a synchronous DRAM (SDRAM), and the like) and a non-volatile memory (e.g., a one time programmable read only memory (OTPROM), a PROM, an erasable and programmable ROM (EPROM), an electrically erasable and programmable ROM (EEPROM), a mask ROM, a flash ROM, a flash memory (e.g., a NAND flash memory or a NOR flash memory), a hard disk drive, a solid state drive (SSD), and the like).

The external memory 234 may further include a flash drive, for example, a compact flash (CF), a secure digital (SD), a micro-SD, a mini-SD, an extreme digital (xD), a multimediacard (MMC), a memory stick, or the like. The external memory 234 may be functionally and/or physically connected to the electronic device 201 through various interfaces.

The sensor module 240, for example, may measure a physical quantity or detect an operation state of the electronic device 201, and may convert the measured or detected information into an electrical signal. The sensor module 240 may include, for example, at least one of a gesture sensor 240A, a gyro sensor 240B, an atmospheric pressure sensor (barometer) 240C, a magnetic sensor 240D, an acceleration sensor 240E, a grip sensor 240F, a proximity sensor 240G, a color sensor 240H (e.g., red, green, and blue (RGB) sensor), a biometric sensor (medical sensor) 240I, a temperature/humidity sensor 240J, an illuminance (e.g., light) sensor 240K, and a ultra violet (UV) sensor 240M. Additionally or alternatively, the sensor module 240 may include, for example, an E-nose sensor, an electromyography (EMG) sensor, an electroencephalogram (EEG) sensor, an electrocardiogram (ECG) sensor, an infrared (IR) sensor, an iris scan sensor, and/or a finger scan sensor. The sensor module 240 may further include a control circuit for controlling one or more sensors included therein. According to an embodiment of the present disclosure, the electronic device 201 may further include a processor configured to control the sensor module 240, as a part of the processor 210 or separately from the processor 210, and may control the sensor module 240 while the processor 210 is in a sleep state.

The input device 250 may include, for example, and without limitation, a touch panel 252, a (digital) pen sensor 254, a key 256, or an ultrasonic input device 258. The touch panel 252 may use, for example, at least one of a capacitive type, a resistive type, an infrared type, and an ultrasonic type. The touch panel 252 may further include a control circuit. The touch panel 252 may further include a tactile layer, and provide a tactile reaction to the user.

The (digital) pen sensor 254 may include, for example, a recognition sheet which is a part of the touch panel or is separated from the touch panel. The key 256 may include, for example, a physical button, an optical key or a keypad. The ultrasonic input device 258 may detect, through a microphone (e.g., the microphone 288), ultrasonic waves generated by an input tool, and identify data corresponding to the detected ultrasonic waves.

The display 260 (e.g., the display 160) may include a panel 262, a hologram device 264, or a projector 266.

The panel 262 may include a configuration identical or similar to the display 160 illustrated in FIG. 1. The panel 262 may be implemented to be, for example, flexible, transparent, or wearable. The panel 262 may be embodied as a single module with the touch panel 252. The hologram device 264 may show a three dimensional (3D) image in the air by using an interference of light. The projector 266 may project light onto a screen to display an image. The screen may be located, for example, in the interior of or on the exterior of the electronic device 201. According to an embodiment of the present disclosure, the display 260 may further include a control circuit for controlling the panel 262, the hologram device 264, or the projector 266.

The interface 270 may include, for example, and without limitation, a HDMI 272, a USB 274, an optical interface 276, or a D-subminiature (D-sub) 278. The interface 270 may be included in, for example, the communication interface 170 illustrated in FIG. 1. Additionally or alternatively, the interface 270 may include, for example, a mobile high-definition Link (MHL) interface, an SD card/MMC interface, or an IrDA standard interface.

The audio module 280, for example, may bilaterally convert a sound and an electrical signal. At least some components of the audio module 280 may be included in, for example, the input/output interface 150 illustrated in FIG. 1. The audio module 280 may process voice information input or output through, for example, a speaker 282, a receiver 284, earphones 286, or the microphone 288. The audio module 280 may perform a function of transmitting audio signals received from the processor 210 to an audio output device (e.g., the speaker 282, the receiver or the earphones 286, etc.) and may perform a function of transmitting, to the processor 210, audio signals, such as a voice, which is input from the microphone 288. The audio module 280 may convert voice/sound data into audible sounds in order to thereby output the same to the speaker 282, and may convert audio signals, such as a voice, which are received from the microphone 288, into digital signals in order to thereby transmit the same to the processor 210, according to the control of the processor 210.

The speaker 282 or the receiver 284 may output audio data, which is received from the communication unit 220 or is stored in the memory 230. The speaker 282 or the receiver 284 may output sound signals in relation to various operations (functions), which are performed by the electronic device 201.

The microphone 288 may receive external sound signals, and may convert the same to electrical sound data. The microphone 288 may have a variety of noise reduction algorithms to remove noise generated in the course of receiving the external sound signals. The microphone 288 may play the role of inputting the audio streaming, such as a voice instruction.

The camera module 291 is, for example, a device which may photograph a still image and a video. According to an embodiment of the present disclosure, the camera module 291 may include one or more image sensors (e.g., a front sensor or a back sensor), a lens, an image signal processor (ISP) or a flash (e.g., LED or xenon lamp).

The power management module 295 may manage, for example, power of the electronic device 201. According to an embodiment of the present disclosure, the power management module 295 may include a power management integrated circuit (PMIC), a charger IC, or a battery or fuel gauge. The PMIC may use a wired and/or wireless charging method. Examples of the wireless charging method may include, for example, a magnetic resonance method, a magnetic induction method, an electromagnetic wave method, and the like. Additional circuits (e.g., a coil loop, a resonance circuit, a rectifier, etc.) for wireless charging may be further included. The battery gauge may measure, for example, a residual quantity of the battery 296, and a voltage, a current, or a temperature while charging. The battery 296 may include, for example, a rechargeable battery and/or a solar battery.

The indicator 297 may display a particular state (e.g., a booting state, a message state, a charging state, or the like) of the electronic device 201 or a part (e.g., the processor 210) of the electronic device 201. The motor 298 may convert an electrical signal into a mechanical vibration, and may generate a vibration, a haptic effect, or the like. Although not illustrated, the electronic device 201 may include a processing device (e.g., a GPU) for supporting a mobile TV. The processing device for supporting a mobile TV may process, for example, media data according to a certain standard such as digital multimedia broadcasting (DMB), digital video broadcasting (DVB), or mediaFLO™.

Each of the above-described component elements of hardware according to the present disclosure may be configured with one or more components, and the names of the corresponding component elements may vary based on the type of electronic device. In various embodiments, the electronic device may include at least one of the above-described elements. Some of the above-described elements may be omitted from the electronic device, or the electronic device may further include additional elements. Also, some of the hardware components according to various embodiments may be combined into one entity, which may perform functions identical to those of the relevant components before the combination.

Figure 3:
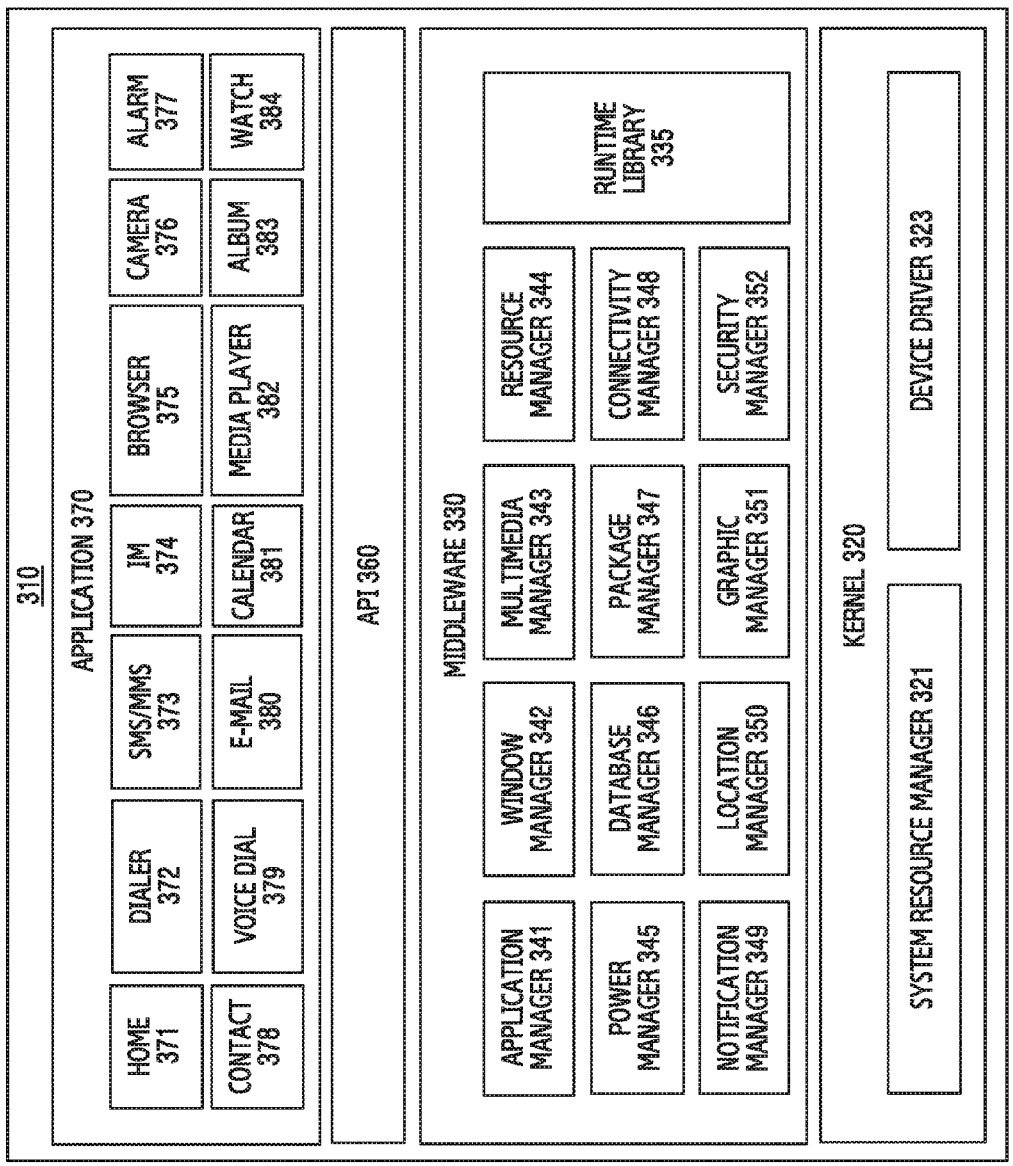
FIG. 3 is a block diagram of a program module according to various embodiments of the present disclosure.

FIG. 3 is a block diagram of a program module according to various embodiments of the present disclosure.

According to an embodiment of the present disclosure, the program module 310 (e.g., the program 140) may include an OS for controlling resources related to the electronic device (e.g., the electronic device 101) and/or various applications (e.g., the application programs 147) executed in the operating system. The operating system may be, for example, Android™, iOS™, Windows™, Symbian™, Tizen™, Bada™, or the like.

The program module 310 may include a kernel 320, middleware 330, an API 360, and/or applications 370. At least some of the program module 310 may be preloaded on an electronic device, or may be downloaded from an external electronic device (e.g., the electronic device 102 or 104, or the server 106).

The kernel 320 (e.g., the kernel 141) may include, for example, a system resource manager 321 and/or a device driver 323. The system resource manager 321 may control, allocate, or collect system resources. According to an embodiment of the present disclosure, the system resource manager 321 may include a process management unit, a memory management unit, a file system management unit, and the like. The device driver 323 may include, for example, a display driver, a camera driver, a Bluetooth driver, a shared memory driver, a USB driver, a keypad driver, a Wi-Fi driver, an audio driver, or an inter-process communication (IPC) driver.

For example, the middleware 330 may provide a function required in common by the applications 370, or may provide various functions to the applications 370 through the API 360 so as to enable the applications 370 to efficiently use the limited system resources in the electronic device. According to an embodiment of the present disclosure, the middleware 330 (e.g., the middleware 143) may include at least one of a run time library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include a library module that a compiler uses in order to add a new function through a programming language while an application 370 is being executed. The runtime library 335 may perform input/output management, memory management, the functionality for an arithmetic function, or the like.

The application manager 341 may manage, for example, a life cycle of at least one of the applications 370. The window manager 342 may manage graphical user interface (GUI) resources used by a screen. The multimedia manager 343 may recognize a format required for reproduction of various media files, and may perform encoding or decoding of a media file by using a codec suitable for the corresponding format. The resource manager 344 may manage resources of a source code, a memory, and a storage space of at least one of the applications 370.

The power manager 345 may operate together with, for example, a basic input/output system (BIOS) or the like to manage a battery or power source and may provide power information or the like required for the operations of the electronic device. The database manager 346 may generate, search for, and/or change a database to be used by at least one of the applications 370. The package manager 347 may manage installation or an update of an application distributed in a form of a package file.

For example, the connectivity manager 348 may manage wireless connectivity such as Wi-Fi or BT. The notification manager 349 may display or notify of an event such as an arrival message, promise, proximity notification, and the like in such a way that does not disturb a user. The location manager 350 may manage location information of an electronic device. The graphic manager 351 may manage a graphic effect which will be provided to a user, or a user interface related to the graphic effect. The security manager 352 may provide all security functions required for system security, user authentication, or the like.

According to an embodiment of the present disclosure, when the electronic device (e.g., the electronic device 101) has a telephone call function, the middleware 330 may further include a telephony manager for managing a voice call function or a video call function of the electronic device. The middleware 330 may include a middleware module that forms a combination of various functions of the above-described components. The middleware 330 may provide a module specialized for each type of OS in order to provide a differentiated function. Further, the middleware 330 may dynamically remove some of the existing components or add new components.

The API 360 (e.g., the API 145) is, for example, a set of API programming functions, and may be provided with a different configuration according to an OS. For example, in the case of Android™ or iOS™, one API set may be provided for each platform. In the case of Tizen™, two or more API sets may be provided for each platform.

The applications 370 (e.g., the application programs 147) may include, for example, one or more applications which may provide functions such as a home 371, a dialer 372, a short message service (SMS)/multimedia message service (MMS) 373, an instant message (IM) 374, a browser 375, a camera 376, an alarm 377, a contact 378, a voice dial 379, an email 380, a calendar 381, a media player 382, an album 383, a watch 384 or the like. According to various embodiments, the application 370 may include an application for providing a health care (e.g., for measuring exercise quantity or blood sugar, etc.), environment information (e.g., providing atmospheric pressure, humidity, or temperature information), a noise detection application for improving the signal quality of the electronic device, or the like.

According to an embodiment of the present disclosure, the applications 370 may include an application (hereinafter, referred to as an "information exchange application" for convenience of description) that supports exchanging information between the electronic device (e.g., the electronic device 101) and an external electronic device (e.g., the electronic device 102 or 104). The information exchange application may include, for example, a notification relay application for transferring specific information to an external electronic device or a device management application for managing an external electronic device.

For example, the notification relay application may include a function of transferring, to the external electronic device (e.g., the electronic device 102 or 104), notification information generated from other applications of the electronic device 101 (e.g., an SMS/MMS application, an e-mail application, a health management application, or an environmental information application). Further, the notification relay application may receive notification information from, for example, an external electronic device and provide the received notification information to a user.

The device management application may manage (e.g., install, delete, or update), for example, at least one function of an external electronic device (e.g., the electronic device 102 or 104) communicating with the electronic device (e.g., a function of turning on/off the external electronic device itself (or some components) or a function of adjusting the brightness (or a resolution) of the display), applications operating in the external electronic device, and services provided by the external electronic device (e.g., a call service or a message service).

According to an embodiment of the present disclosure, the applications 370 may include applications (e.g., a health care application of a mobile medical appliance or the like) designated according to an external electronic device (e.g., attributes of the electronic device 102 or 104). According to an embodiment of the present disclosure, the applications 370 may include an application received from an external electronic device (e.g., the server 106, or the electronic device 102 or 104). According to an embodiment of the present disclosure, the applications 370 may include a preloaded application or a third party application that may be downloaded from a server. The names of the components of the program module 310 of the illustrated embodiment of the present disclosure may change according to the type of operating system.

According to various embodiments, at least a part of the programming module 310 may be implemented in software, firmware, hardware, or a combination of two or more thereof. At least some of the program module 310 may be implemented (e.g., executed) by, for example, the processor (e.g., the processor 1410). At least some of the program module 310 may include, for example, a module, a program, a routine, a set of instructions, and/or a process for performing one or more functions.

The term "module" as used herein may, for example, refer to a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of a dedicated processor, a CPU, an application-specific IC (ASIC) chip, a field-programmable gate arrays (FPGA), and a programmable-logic device for performing operations which has been known or are to be developed hereinafter.

According to various embodiments, at least some of the devices (for example, modules or functions thereof) or the method (for example, operations) according to the present disclosure may be implemented by a command stored in a computer-readable storage medium in a programming module form. The instruction, when executed by a processor (e.g., the processor 120), may cause the one or more processors to execute the function corresponding to the instruction. The computer-readable recoding media may be, for example, the memory 130.

The computer readable recoding medium may include a hard disk, a floppy disk, magnetic media (e.g., a magnetic tape), optical media (e.g., a compact disc ROM (CD-ROM) and a DVD), magneto-optical media (e.g., a floptical disk), a hardware device (e.g., a ROM, a RAM, a flash memory), and the like. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

Any of the modules or programming modules according to various embodiments of the present disclosure may include at least one of the above described elements, exclude some of the elements, or further include other additional elements. The operations performed by the modules, programming module, or other elements according to various embodiments of the present disclosure may be executed in a sequential, parallel, repetitive, or heuristic manner. Further, some operations may be executed according to another order or may be omitted, or other operations may be added.

Hereinafter, operating methods and apparatuses according to various embodiments of the present disclosure will be described with reference to the accompanying drawings. However, it should be noted that since various embodiments of the present disclosure are not limited or restricted by details present below, the present disclosure may be applicable to various embodiments based on the following embodiments. In various embodiments of the present disclosure to be described below, hardware approaches are illustrated for example. However, since various embodiments of the present disclosure include technologies using both hardware and software, various embodiments of the present disclosure are not construed as excluding software-based approaches.

Figure 4:
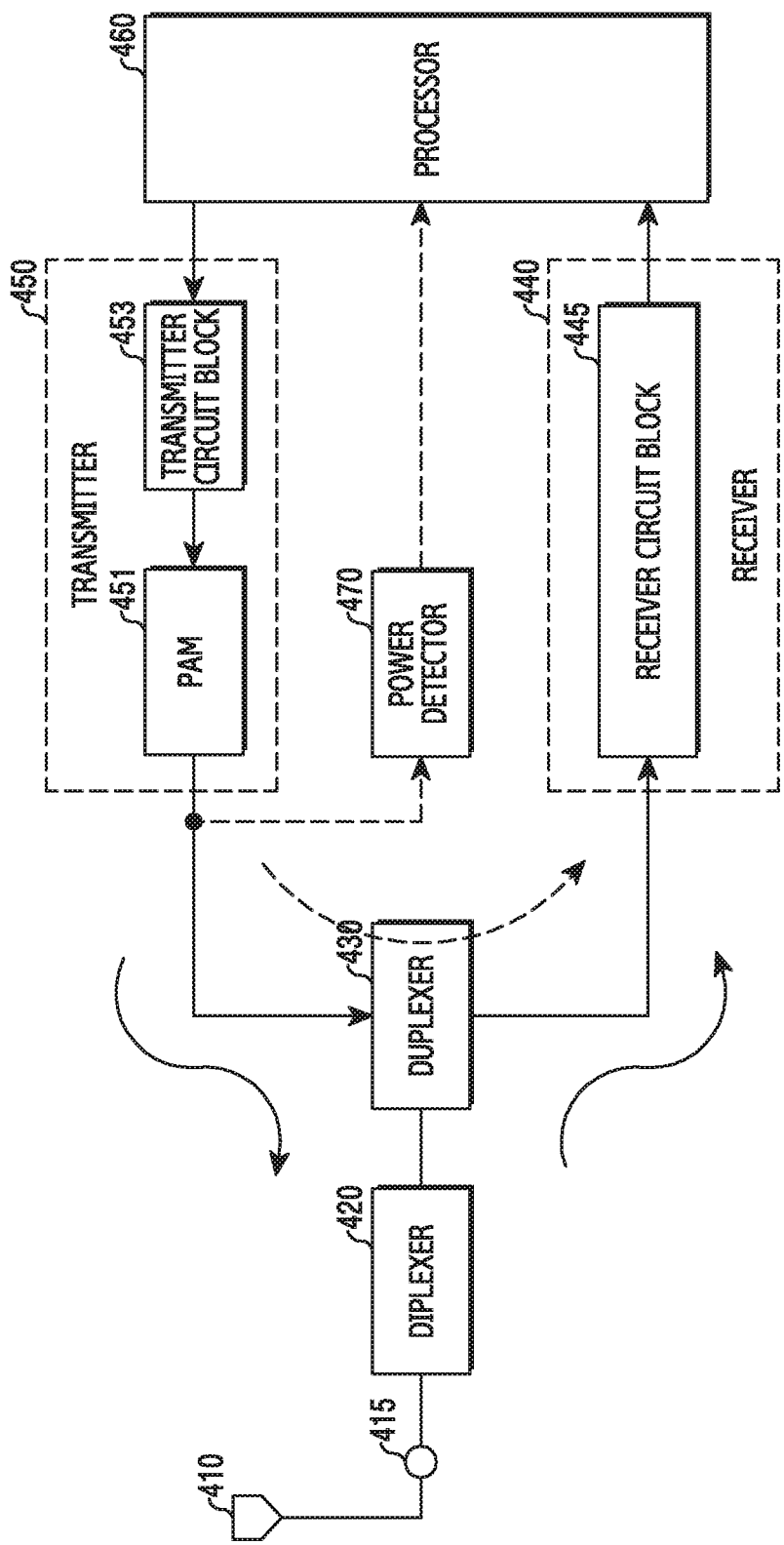
FIG. 4 illustrates a signal transmission/reception operation of an electronic device according to various embodiments of the present disclosure.
Figure 5:
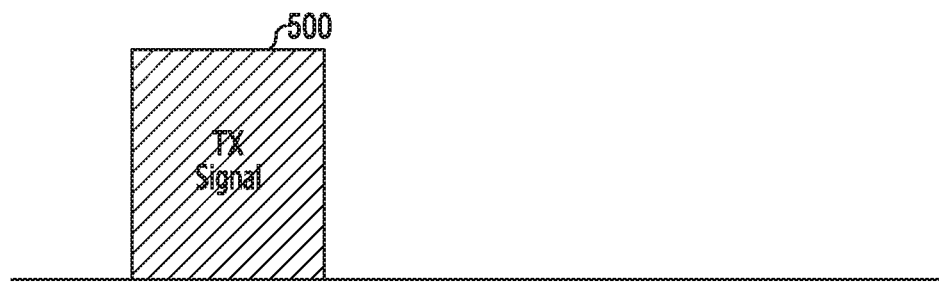
FIGS. 5 and 6 illustrate noise in a sensitivity decrease in an electronic device according to various embodiments of the present disclosure.
Figure 6:
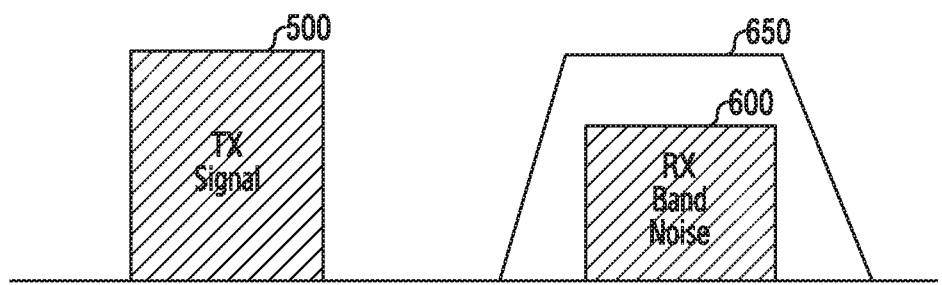

FIGS. 4, 5, and 6 schematically illustrate an electronic device and an operation thereof according to various embodiments of the present disclosure.

Referring to FIG. 4, the electronic device may include an antenna 410, a diplexer 420, a duplexer 430, a receiver 440, a transmitter 450, a power detector 470, and a processor 460 (for example, a processor including a processing circuitry). The receiver 440 may include a receiver circuit block 445, and the transmitter 450 may include a PAM 451 and a transmitter circuit block 453.

Describing a received signal path of the electronic device with reference to FIG. 4, a RF may be received by the antenna 410 and may be divided into bands through the diplexer 420. A signal in a specific band divided by the diplexer 420 may be routed through the duplexer 430 to be transmitted to the receiver 440. In the receiver 440, an input signal (for example, a received signal) may be processed through the receiver circuit block 445 and may be transmitted to the processor 460.

Although not shown, the receiver circuit block 445 may include various circuit blocks. For example, the receiver circuit block 445 may include an amplifier (for example, an LNA), a filter (for example, a surface acoustic wave (SAW) filter, a band pass filter (BPF), and a low pass filter (LPF)), a down converter, an amplifier, and an analog-to-digital converter (ADC). Signal processing (for example, down conversion in frequency, amplification, filtering, and sampling digital conversion) by these components is a well-known technology, and thus a description thereof is omitted.

The processor 460 may perform a relevant operation of the electronic device corresponding to a received signal.

Describing a transmitted signal path of the electronic device with reference to FIG. 4, the processor 460 may process data to be transmitted and may transmit the data to the transmitter 450. In the transmitter 450, an input signal (for example, a transmitted signal) may be processed through the transmitter circuit block 453.

Although not shown, the transmitter circuit block 453 may include various circuit blocks. For example, the transmitter circuit block 453 may include a digital-to-analog converter (DAC), an up converter, a filter (for example, an SAW filter, a BPF, and an LPF), and an amplifier. Signal processing (for example, analog conversion, up conversion in frequency, filtering, and amplification) by these components is a well-known technology, and thus a description thereof is omitted. In the transmitter 450, the signal processed by the transmitter circuit block 453 may be amplified by the PAM 451 and may be routed through the duplexer 430 to be transmitted to the outside (for example, the base station or the like) through the diplexer 420 and the antenna 410.

The power detector 470 may detect transmission power (for example, RF power) based on a transmitted signal output from the PAM 451 of the transmitter 450 and may transmit the transmission power to the processor 460. Although various embodiments illustrates that the power detector 470 is configured to detect a signal between the duplexer 430 and the PAM 451, the power detector 470 is not limited thereto. For example, the power detector 470 may be configured to detect a signal between the diplexer 420 and the duplexer 430.

The power detector 470 may detect a peak signal (or peak RF voltage) of the RF signal output through the PAM 451 (or the duplexer 430) and may provide the detected signal to the processor 460. For example, the power detector 470 may be designed to detect an envelope of the RF signal, and the detected signal may include an amplitude related to the power level of the RF signal. Alternatively, the power detector 470 may be designed as a peak detector that detects the amplitude of the peak signal of the RF signal, and may detect an RF voltage of the RF signal to provide the detected signal to the processor 460.

The processor 460 may perform power control based on the transmission power transmitted from the power detector 470. The processor 460 may provide the PAM 451 with a control signal for adjusting the power (for example, RF power) of the PAM 451. The processor 460 may determine a suitable power level (or bias) for the PAM 451 corresponding to a detection result from the power detector 470 and may perform power control of the PAM 451 based on a control algorithm (for example, an RF power level and/or bias control algorithm).

In the electronic device, the components excluding the antenna 410 may be installed within a circuit board, and a terminal of the antenna 410 may be connected to the circuit board through an RF connector 415, and thus the antenna 410 may be separate from the circuit board.

In the electronic device, the transmitter 450 and the receiver 440 may simultaneously operate, and various circuit blocks of the receiver 440 may receive interference from the transmitter 450. For example, some transmitted signals from the transmitter 450 may infiltrate into the receiver 440 from the duplexer 430 to act as noise to a received signal of the receiver 440. For example, the PAM 451 of the transmitter 450 may serve to amplify a signal, which passes through the transmitter circuit block 453, into a signal with a suitable strength in view of loss in the duplexer 430.

The PAM 451 is mainly aimed at realizing maximum output power, not realizing maximum gain, and thus may amplify a transmitted signal according to a maximum output power point to output the transmitted signal. The transmitted signal amplified by the PAM 451 may be routed through the duplexer 430 to be transmitted through the antenna 410. Further, some transmitted signals may infiltrate into the received signal path through the duplexer 430 to act as noise in a receiving end (for example, a received (Rx) band), causing a sensitivity decrease.

At an output terminal of the PAM 451, an output-terminal reflection coefficient may increase. For example, output power from the PAM 451 may be retroreflected to return to the output terminal of the PAM 451. In this case, an impedance change at a rear terminal of the PAM 451 may affect an operation of the PAM 451. According to one embodiment, when the reflection coefficient at the output terminal of the PAM 451 is high (increases), a standing voltage at the output terminal of the PAM 451 increases. That is, the strength of a standing wave at the output end of the PAM 451 increases. Thus, when the reflection coefficient of the PAM 451 increases, the voltage of an output signal alone from the output terminal and a voltage caused by the reflection coefficient (hereinafter, noise) may be added to form a higher voltage, thus allowing a transmitted signal to infiltrate into the received signal path, which is illustrated in FIGS. 5 and 6.

For example, FIG. 5 illustrates a case in which a transmitted signal (Tx signal) is normally output to the transmitted signal path. Referring to FIG. 5, when a normal signal occurs, only a Tx wave 500 may be output.

For example, FIG. 6 illustrates a case in which a transmitted signal infiltrates into the received signal path. Referring to FIG. 6, when noise occurs, not only a Tx wave 500 (for example, a standing wave) but also a noise wave 600 (for example, a noise wave acting as noise in an Rx band) may be output. For example, when a normal signal occurs, only a Tx wave 500 is output, as in FIG. 5. However, due to Tx harmonic (for example, harmonic waves (waves generated with a frequency of a multiple of an integer, for example, two times, three times, or four times a basic frequency)) components, a noise 600 caused by the Tx signal may infiltrate in the Rx band, as in FIG. 6. According to one embodiment, in high power transmission, high noise occurring by the PAM 451 in a receiving band may cause a sensitivity decrease.

According to one embodiment, the receiver 440 may receive a desired signal (for example, a normal Rx signal) and a transmitted signal infiltrating into the received signal path, which acts as noise, (for example, Rx-band noise). Such noise may cause deterioration in the performance of the received signal path (for example, a received sensitivity decrease). Accordingly, various embodiments disclose a method and an apparatus for stabilizing a circuit and improving signal quality by detecting and eliminating Rx-band noise in an electronic device. In the example of FIG. 6, a polygon 650 indicates a filter that passes a specific band (for example, a band-pass filter). For example, only the Rx-band noise may pass through the filter 650, while the transmitted signal may be eliminated. The filter 650 will be described with reference to the following drawings.

Figure 7:
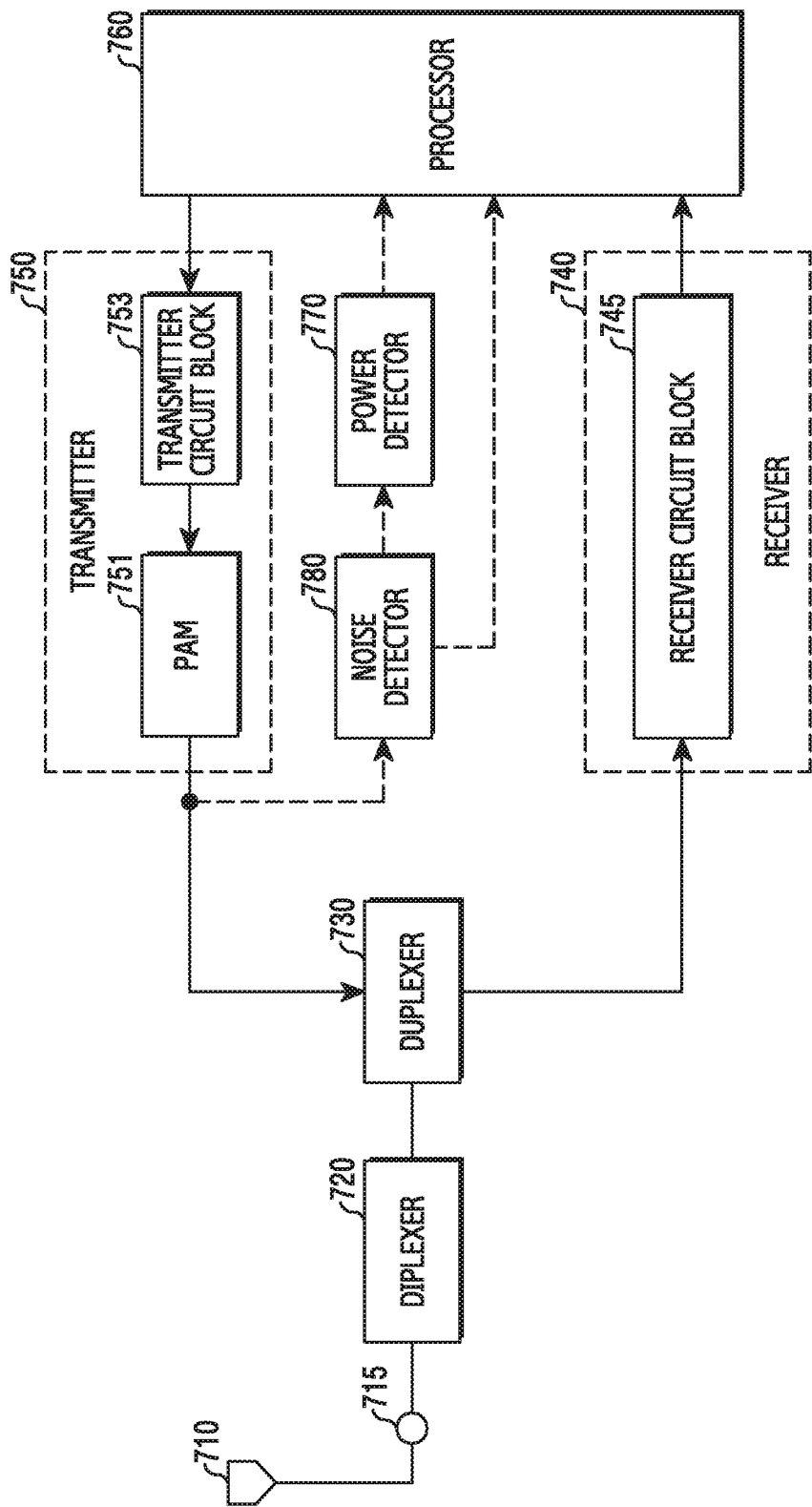
FIGS. 7 and 8 schematically illustrate an electronic device and an operation thereof according to various embodiments of the present disclosure.
Figure 8:
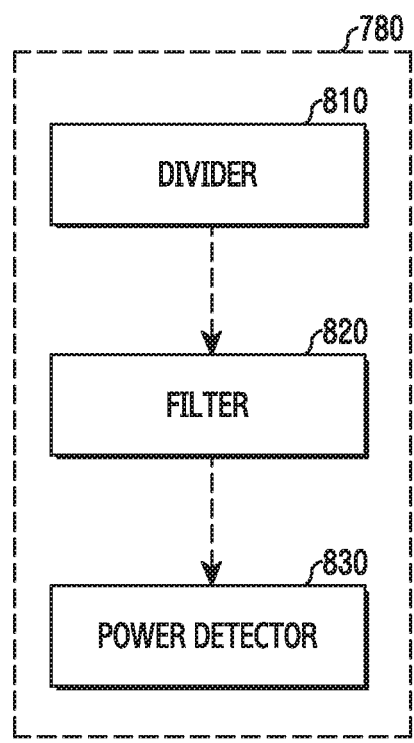

FIGS. 7 and 8 schematically illustrate an electronic device and an operation thereof according to various embodiments of the present disclosure.

Referring to FIG. 7, the electronic device may include an antenna 710, an RF connector 715, a diplexer 720, a duplexer 730, a receiver 740, a transmitter 750, a power detector 770, a noise detector 780, and a processor 760 (for example, a processor including a processing circuitry). The receiver 740 may include a receiver circuit block 745, and the transmitter 450 may include a PAM 751 and a transmitter circuit block 753. According to various embodiments, the electronic device may be configured to include a greater or lower number of components than the components illustrated in FIG. 7. In various embodiments, the components other than the noise detector 780 in FIG. 7 may correspond to the circuit components described above with reference to FIG. 4, and thus a description thereof is omitted.

The noise detector 780 may detect noise (or Rx-band noise having impact on a received signal path) occurring from the transmitter 750 (particularly, a power amplifier (PAM) 751). Various embodiments illustrate that the noise detector 780 is provided between the duplexer 730 and the power amplifier (hereinafter, the PAM 751) to detect a signal, but the noise detector 780 is not limited thereto. For example, the noise detector 780 may be provided to detect a signal between the diplexer 720 and the duplexer 730.

According to one embodiment, the noise detector 780 may detect a peak signal (or peak RF voltage) of the RF signal output through the PAM 751 (or the duplexer 730) and may provide the detected signal to the power detector 770 and the processor 760. For example, the noise detector 780 may be designed to detect an envelope of the RF signal, and the detected signal may include an amplitude related to the power level of the RF signal.

According to one embodiment, the noise detector 780 may be designed as a peak detector that detects the amplitude of the peak signal of the RF signal, and may detect an RF voltage of the RF signal to provide the detected signal to the power detector 770 and the processor 760.

According to various embodiments, the noise detector 780 may provide the detected signal (for example, a first signal and a second signal) to the power detector 770, and may filter the second signal from the detected signal to provide the filtered second signal to the processor 760. According to one embodiment, the first signal may include the RF signal (for example, a normal transmitted signal), and the second signal may include a signal (or frequency) in a band different from the first signal. According to one embodiment, the second signal may be in an Rx band to infiltrate into the received signal path. Therefore, the noise detector 780 may filter only the Rx-band second signal from the detected signal to provide the second signal to the processor 760.

FIG. 8 schematically illustrates an internal circuit configuration of the noise detector according to various embodiments of the present disclosure.

Referring to FIG. 8, the noise detector 780 may include a divider 810, a filter 820, and a power detector 830. In FIG. 8 and the following description, to distinguish the power detector 770 connected to the noise detector 780 from the power detector 830 in the noise detector 780, the power detector 770 may be defined as a first power detector and the power detector 830 may be defined as the second power detector.

The divider 810 may be a component that distributes an input signal (for example, a received signal and noise) to the first power detector 770 and the filter 820. According to one embodiment, when the electronic device does not include the first power detector 770, the divider 810 may not be included in the electronic device.

The filter 820 may include a filter that eliminates an unset signal from the input signal of the divider 810 and filters only a specific signal. For example, the filter 820 may filter a second signal as Rx-band noise from the input signal (for example, a first signal and a second signal). According to various embodiments, the filter 820 may be provided as a BPF that filters a set band. For example, the PAM 751 may amplify and output the signal with maximum output power, in which the amplified signal may include not only a signal required to be detected (for example, Rx-band noise as the second signal) but also a spurious not required to be detected (for example, the normal first signal). The filter 820 may serve to pass only the second signal in the set band (for example, an Rx band) of the amplified signal and to eliminate the spurious. That is, the filter 820 serves to selectively band-pass only a specific frequency with low insertion loss and to eliminate other unnecessary frequencies, in which a frequency bandwidth may be set variously. According to various embodiments, a filtering operation of the filter 820 will be described with reference to FIGS. 9 and 10.

The power detector 830 may be the second power detector that detects power (for example, voltage and current) from an output in a band passing through the filter 820, unlike the first power detector 770 that detects power (for example, voltage and current) from an output from the PAM 751. For example, the power detector 830 may receive a signal filtered through the filter 820 (for example, the second signal or VRF), may detect a peak signal (for example, a peak RF voltage (VDET)) of the filtered signal, and may provide the detected peak signal to the processor 760. According to various embodiments, the power detector 830 may be designed to detect an envelope of an RF signal, and the detected signal may include an amplitude related to the power level of the RF signal. Further, the power detector 830 may be designed as a peak detector that detects the amplitude of the peak signal of the RF signal, and may detect an RF voltage of the RF signal to provide the detected signal to the processor 760.

Referring back to FIG. 7, the processor 760 may determine a bias (for example, voltage or current) of the PAM 751 based on at least one of a detected signal (for example, a first RF power level) from the first power detector 770 and a detected signal (for example, a second RF power level) from the noise detector 780 (for example, the second power detector 830). For example, the processor 760 may detect different power levels related to the output power of the PAM 751 by at least one of the noise detector 780 and the first power detector 770. According to one embodiment, the first RF power level and the second RF power level may include, for example, different voltages based on different bands or different frequencies. The processor 760 may provide the PAM 715 with one or more bias control signals to adjust the bias of the PAM 751 based on a detected RF power level, thereby performing control over the output power of the PAM 751.

According to one embodiment, when the processor 760 receives the first RF power level from the first power detector 770, the processor 760 may determine a bias (for example, a power control value by each first RF power level) to adjust the output power of the PAM 751 based on a predefined mapping table for the first RF power level and may control the output power of the PAM 751 based on the determined bias.

According to one embodiment, when the processor 760 receives the second RF power level from the second power detector 830, the processor 760 may determine a bias (for example, a power control value by each second RF power level) to adjust the output power of the PAM 751 based on a predefined mapping table for the second RF power level and may control the output power of the PAM 751 based on the determined bias.

According to one embodiment, when the processor 760 receives the first RF power level and the second RF power level from the first power detector 770 and the second power detector 830, respectively, the processor 760 may determine a bias to adjust the output power of the PAM 751 according to a predefined method and may control the output power of the PAM 751 based on the determined bias. For example, when the first RF power level and the second RF power level are detected together (or simultaneously), the processor 760 may determine the bias preferentially considering the second RF power level, disregarding the first RF power level. For another example, when the first RF power level and the second RF power level are detected together (or simultaneously), the processor 760 may determine a second bias by adjusting a first bias based on the first RF power level downward considering the second RF power level.

Figure 9:
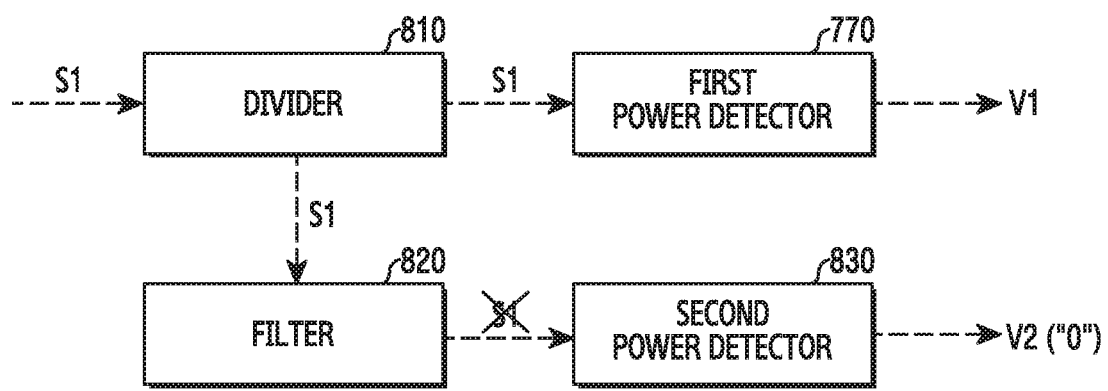
FIGS. 9 and 10 illustrate a noise detection operation of an electronic device according to various embodiments of the present disclosure.
Figure 10:
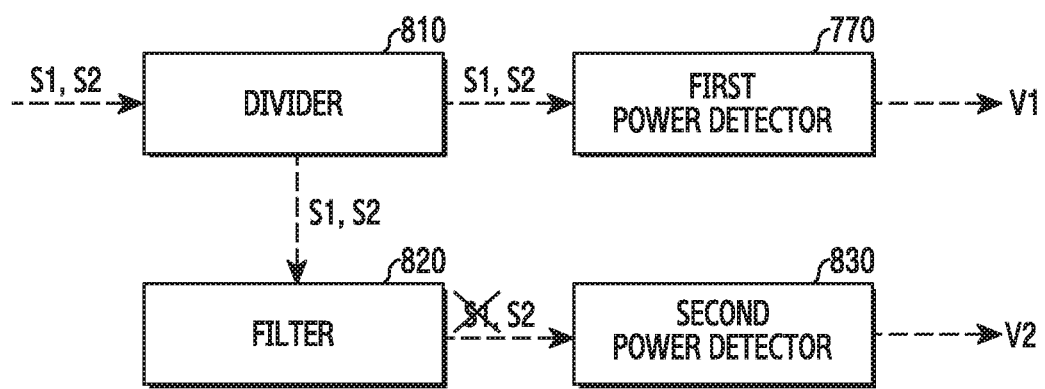

FIGS. 9 and 10 illustrate a noise detection operation of an electronic device according to various embodiments of the present disclosure.

FIG. 9 illustrates an operation of detecting an RF power level in the absence of Rx-band noise, for example, in the case where a transmitted signal is normally output according to an embodiment of the present disclosure.

Referring to FIG. 9, a first RF signal (for example, S1) from the PAM 751 may be distributed by the divider 810 to the first power detector 770 and the filter 820.

The first power detector 770 may detect power from the first RF signal and may transmit the detected power (for example, voltage (V1=N, where N is an integer)) to the processor 760.

The filter 820 may not pass the input first RF signal. For example, the first RF signal may be a signal unset in the filter 820 and may be eliminated by the filter 820. Thus, the second power detector 830 may detect no power and may transmit zero power (for example, voltage (V2=0)) to the processor 760.

FIG. 10 illustrates an operation of detecting an RF power level in the occurrence of Rx-band noise, for example, in the occurrence of desense by Rx-band noise according to an embodiment of the present disclosure.

Referring to FIG. 10, a first RF signal (for example, S1) and a second RF signal (for example, S2) from the PAM 751 may be distributed by the divider 810 to the first power detector 770 and the filter 820.

The first power detector 770 may detect power based on the first RF signal (for example, S1) and the second RF signal (for example, S2) and may transmit the detected power (for example, voltage (V1=N, where N is an integer)) to the processor 760.

The filter 820 may filter only the second RF signal of the input first and second RF signals. For example, the first RF signal may be a signal unset in the filter 820 and may be eliminated by the filter 820. That is, the filter 820 may pass only the second RF signal in a band, which acts as Rx-band noise, without passing the first RF signal. Thus, the second power detector 830 may detect power and based on the second RF signal may transmit the detected power (for example, voltage (V2=M, where M is an integer)) to the processor 760.

The processor 760 may directly control the output power of the PAM 751 according to a detected signal from the first power detector 770 or the second power detector 830. For example, the processor 760 may control the power of the PAM 751 according to whether the second power detector 830 detects a certain level of voltage. When the certain level of voltage is detected, the processor 760 may control the power reduction of the PAM 751 or may limit a resolution bandwidth (RB) so that the voltage is not subsequently detected by the second power detector 830. That is, the processor 760 may transmit a control signal to the PAM 751 to adjust the output power of the PAM 751.

According to various embodiments, desense may be reduced by using the power reduction of the PAM 751. According to various embodiments, the processor 760 may control the output power of the PAM 751 when a certain level of voltage is detected by the second power detector 830. Subsequently, when the certain level of voltage is not detected by the second power detector 830, the processor 760 may change the changed output power of the PAM 751 again to have maximum output power.

Figure 11:
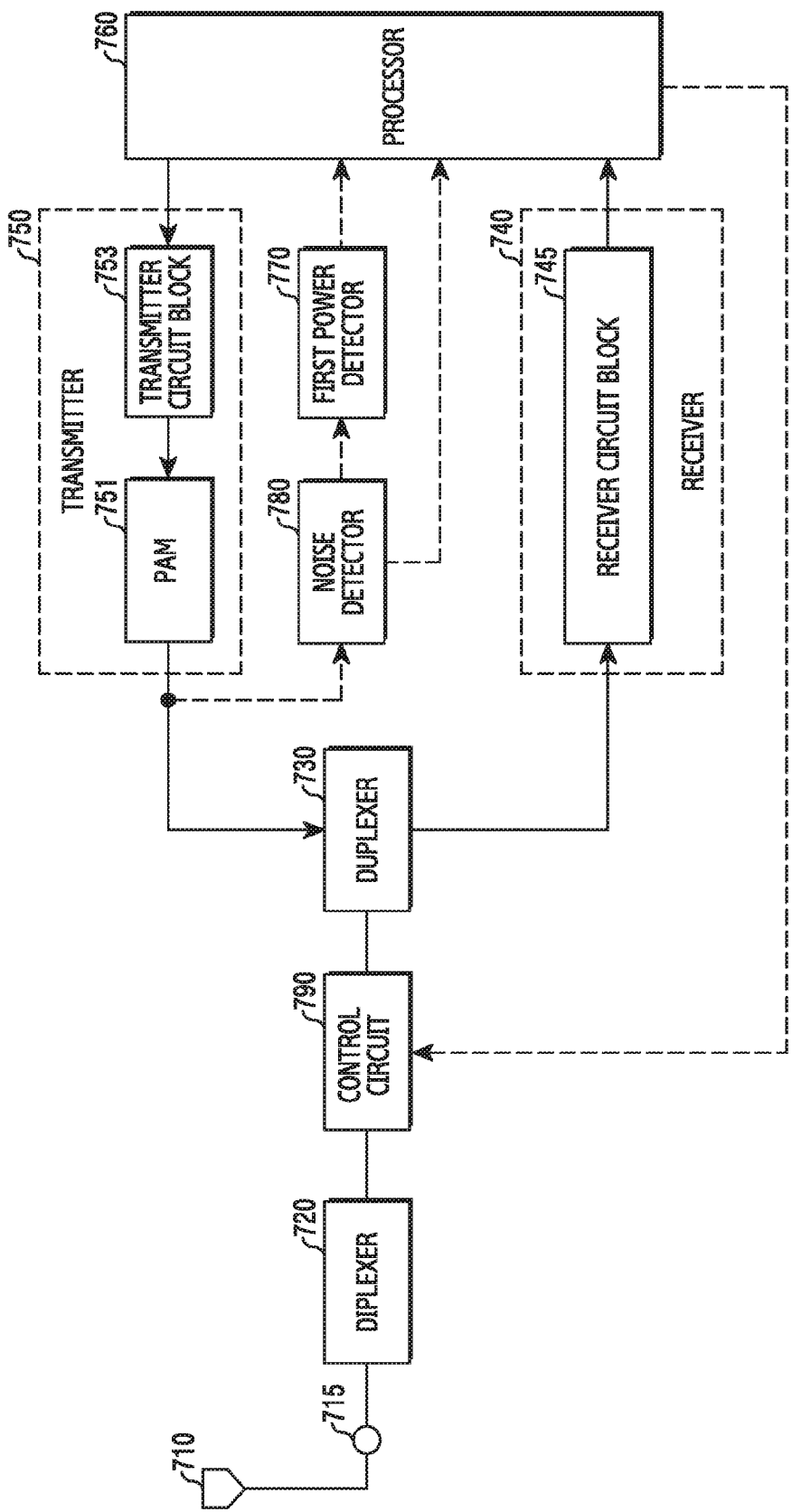
FIG. 11 schematically illustrates an electronic device and an operation thereof according to various embodiments of the present disclosure.

FIG. 11 schematically illustrates an electronic device and an operation thereof according to various embodiments of the present disclosure.

Referring to FIG. 11, the electronic device may further include a control circuit 790 in addition to the components illustrated in FIG. 7. According to various embodiments, the components other than the control circuit 790 may correspond to the circuit components described above with reference to FIG. 7, and thus a description thereof is omitted.

The control circuit 790 may include a circuit for eliminating (or decreasing) desense. For example, the control circuit 790 may be provided as an antenna tuner or a matching circuit. Although FIG. 11 illustrates that the control circuit 790 is provided between the diplexer 720 and the duplexer 730 to perform conditioning (for example, filtering, amplification, or buffering to respond to a specific condition), the control circuit 790 is not limited thereto. For example, the control circuit 790 may be provided between the diplexer 720 and the RF connector 715 to perform conditioning.

According to one embodiment, when the control circuit 790 is provided as an antenna tuner, the control circuit 790 may be provided between the RF connector 715 and the diplexer 720 and may change (or tune) impendence according to control by the processor 760 so as not to detect a voltage at an output terminal of the second power detector 830.

According to one embodiment, when the control circuit 790 is provided as a matching circuit, the control circuit 790 may be provided between the diplexer 720 and the duplexer 730 and may change a load-pull of the PAM 751 according to control by the processor 760 so as not to detect a voltage at the output terminal of the second power detector 830.

According to various embodiments, a load-pull may refer to an operation of detecting a maximum output power point (or impedance point, for example, a point at which the maximum output power capacity is the highest) so that the PAM 751 performs output with the maximum output power, changing (adjusting) the output impedance of the PAM 751. Therefore, the load-pull may perform an operation of changing an output matching element of the control circuit 790 (for example, power matching) to match the maximum output power point. For example, when an impedance point at which the maximum output power is achieved is detected by the load-pull and power matching is performed according to the impedance point, higher maximum output power may be achieved in the PAM 751. The load-pull may provide the maximum linearity, maximum efficiency, and maximum output power of the PAM 751.

The control circuit 790 may provide the PAM 715 with a bias control signal. For example, the control circuit 790 may serve to control (or adjust) the bias current or bias voltage of the PAM 751. The control circuit 790 may adjust the bias current or bias voltage based on the bias control signal to output a desired result by the PAM 751 (not to detect a voltage at the output terminal of the second power detector 830). According to one embodiment, the processor 760 may transmit, to the control circuit 790, the control signal to adjust the bias of the PAM 751 based on a detected RF power level. The control circuit 790 may adjust the bias of the PAM 751 corresponding to the control signal from the processor 760 to maintain linearity through power reduction or minimization.

The processor 760 may indirectly control the output power of the PAM 751 according to a detected signal by the first power detector 770 or the second power detector 830. For example, the processor 760 may control the power of the PAM 751 through the control circuit 790 according to whether the second power detector 830 detects a certain level of voltage. When the certain level of voltage is detected, the processor 760 may control the power of the PAM 751 through the control circuit 790, thereby controlling the power reduction of the PAM 751 or limiting a resolution bandwidth (RB). That is, the processor 760 may transmit the control signal to the control circuit 790 to adjust the output power of the PAM 751.

According to various embodiments, the processor 760 may control the output power of the PAM 751 when a certain level of voltage is detected by the second power detector 830. Subsequently, when the certain level of voltage is not detected by the second power detector 830, the processor 760 may change the changed output power of the PAM 751 again to have maximum output power.

As described above, an electronic device according to various embodiments of the present disclosure may include: a power amplifier (for example, the PAM 751 in FIG. 7) configured to amplify and output a transmitted signal; a noise detector (for example, the noise detector 780 in FIG. 7) configured to detect noise in a receiving band by the power amplifier and to output a power level of the detected noise; and a processor (for example, the processor 760 in FIG. 7), wherein the processor may be configured to: acquire the power level of the noise through the noise detector; acquire control information to change the output power of the power amplifier based on the power level of the noise; and control the output power of the power amplifier based on the control information.

According to various embodiments, the noise detector may include a filter (for example, the filter 820 in FIG. 8) configured to filter the noise in the receiving band from an input from the power amplifier and a power detector (for example, the power detector 830 in FIG. 8) configured to detect the power level of the noise from the noise in the receiving band that is filtered through the filter.

According to various embodiments, the filter may be configured to eliminate a signal other than the noise in the receiving band among the input from the power amplifier and to pass only the noise in the receiving band that is a set band among the input.

According to various embodiments, the electronic device may further include another power detector (for example, the power detector 770 in FIG. 7) configured to detect the output power of the power amplifier for power control of the power amplifier.

According to various embodiments, the noise detector may include a divider (for example, the divider 810 in FIG. 8) configured to distribute the input of the power amplifier to the filter and the other power detector.

According to various embodiments, the processor may be configured to detect different power levels related to the output power of the power amplifier by at least one of the noise detector and the other power detector.

According to various embodiments, the processor may be configured to determine whether desense occurs by the noise in the receiving band in response to whether a second power level is detected by the noise detector.

According to various embodiments, the processor may be configured to perform power control based on first control information on a first power level in response to a detection of the first power level by the other power detector, and to perform power control for eliminating the noise based on second control information on the second power level in response to a detection of the second power level by the noise detector.

According to various embodiments, the processor may be configured to perform power control based on a preset processing method in response to a detection of a first power level by the other power detector and a detection of the second power level by the noise detector.

According to various embodiments, the processor may be configured to perform power control preferentially considering the second power level.

According to various embodiments, the processor may be configured to determine first control information on the first power level as third control information having a lower value than second control information on the second power level by considering the second control information.

According to various embodiments, the processor may be configured to control the output power of the power amplifier, and to change changed output power of the power amplifier to have maximum output power when the power level of the noise is not detected by the noise detector.

According to various embodiments, the electronic device may further include a control circuit (for example, the control circuit 790 in FIG. 11) configured to change an output of the power amplifier, and the control circuit may include an antenna tuner or a matching circuit.

Figure 12:
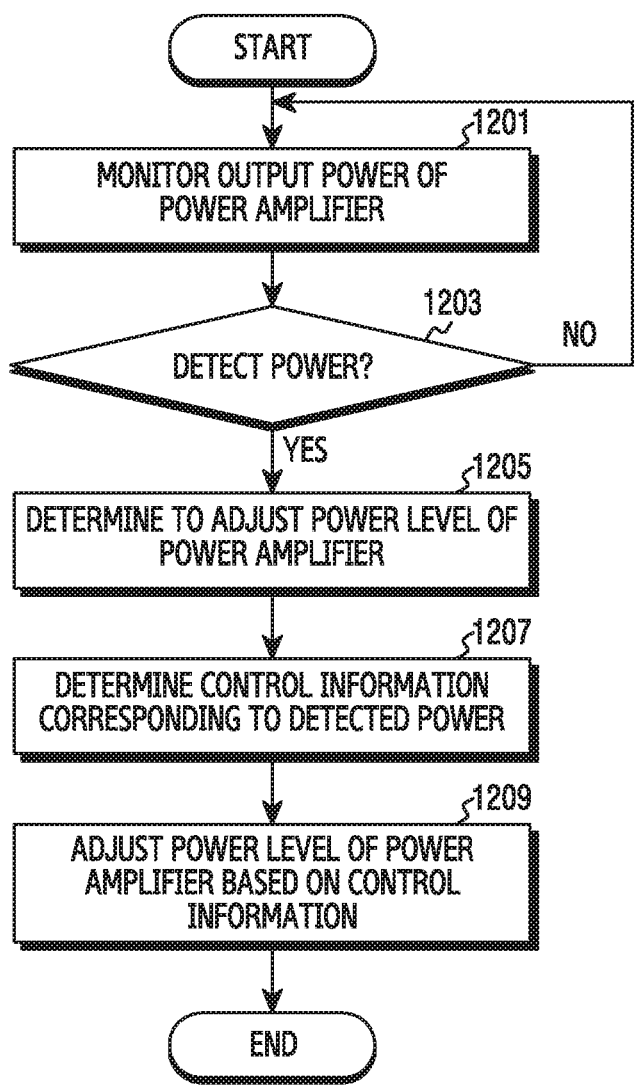
FIG. 12 is a flowchart illustrating an operation in which an electronic device controls an output power of a power amplifier according to various embodiments of the present disclosure.

FIG. 12 is a flowchart illustrating an operation in which an electronic device controls the output power of a power amplifier according to various embodiments of the present disclosure.

Referring to FIG. 12, the processor 760 (for example, the processor 120 in FIG. 1 or 210 in FIG. 2) of the electronic device may monitor the output power of the power amplifier (for example, the PAM 751 of the transmitter 750) in operation 1201, and may determine whether the power is detected in operation 1203. For example, the processor 760 may determine whether a voltage detected by at least one of the power detectors (for example, the first power detector 770 and the noise detector 780 (for example, the second power detector 830)) is received.

When no power is detected in operation 1203 (no in operation 1203), the processor 760 may go to operation 1201 and may perform operation 1201 and subsequent operations.

When the power is detected in operation 1203 (yes in operation 1203), the processor 760 may determine to adjust a power level of the power amplifier in operation 1205. According to one embodiment, when the power is detected by the first power detector 770, the processor 760 may determine power control of the PAM 751 based on the detected power. According to one embodiment, when the power is detected by the second power detector 830, the processor 760 may determine power control of the PAM 751 for noise elimination based on the detected power.

In operation 1207, the processor 760 may determine control information corresponding to the detected power. For example, the processor 760 may determine the bias (for example, voltage or current) of the PAM 751 based on a signal (for example, an RF power level) detected by the first power detector 770 or the noise detector 780 (for example, the second power detector 830).

In operation 1209, the processor 760 may adjust the power level of the power amplifier based on the determined control information. For example, the processor 760 may perform control over the output power of the PAM 751 based on a control signal to adjust the bias of the PAM 751 based on the determined control information corresponding to a detected RF power level. According to various embodiments, the processor 760 may receive one of a first RF power level from the first power detector 770 and a second RF power level from the second power detector 830, or both of the first RF power level and the second RF power level from the first power detector 770 and the second power detector 830. The processor 760 may determine a power control value to adjust the output power of the PAM 751 based on a mapping table corresponding to a received RF power level and may control the output power of the PAM 751 based on the determined power control value.

According to one embodiment, when the processor 760 receives the first RF power level from the first power detector 770, the processor 760 may determine a power control value to adjust the output power of the PAM 751 based on a mapping table corresponding to the first RF power level and may control the output power of the PAM 751 based on the determined power control value.

According to one embodiment, when the processor 760 receives the second RF power level from the second power detector 830, the processor 760 may determine a power control value to adjust the output power of the PAM 751 based on a mapping table corresponding to the second RF power level and may control the output power of the PAM 751 based on the determined power control value.

According to one embodiment, when the processor 760 receives the first RF power level and the second RF power level from the first power detector 770 and the second power detector 830, respectively, the processor 760 may determine a power control value to adjust the output power of the PAM 751 according to a preset control method and may control the output power of the PAM 751 based on the determined power control value. For example, when the first RF power level and the second RF power level are detected together (for example, simultaneously or sequentially), the processor 760 may determine the power control value preferentially considering the second RF power level, disregarding the first RF power level. For another example, when the first RF power level and the second RF power level are detected together (for example, simultaneously or sequentially), the processor 760 may determine a second power control value by adjusting a first power control value based on the first RF power level downward considering the second RF power level.

Figure 13:
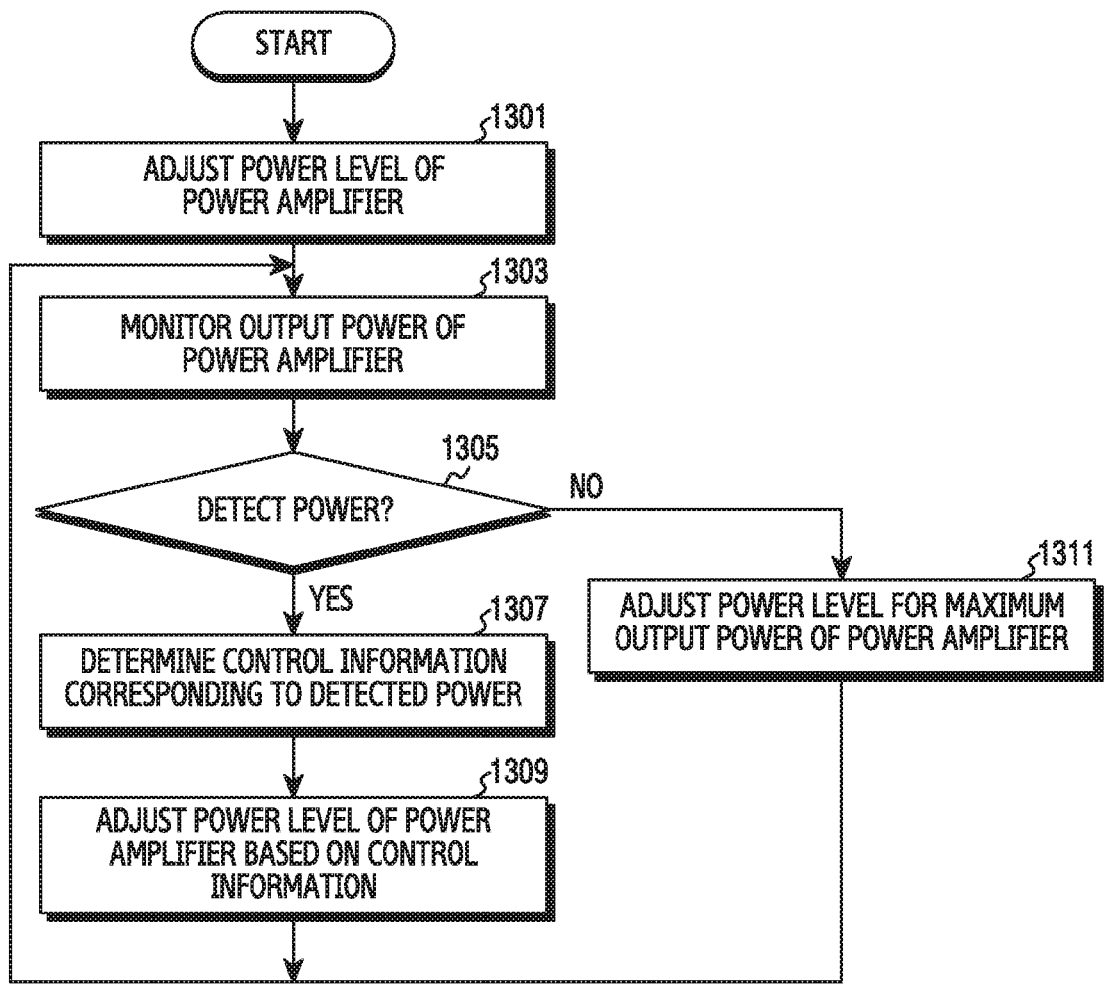
FIG. 13 is a flowchart illustrating an operation in which an electronic device controls an output power of a power amplifier according to various embodiments of the present disclosure.

FIG. 13 is a flowchart illustrating an operation in which an electronic device controls the output power of a power amplifier according to various embodiments.

According to various embodiments, as described above, FIG. 13 illustrates a control operation performed after the output power of the power amplifier (for example, the PAM 751 of the transmitter 750) is adjusted to eliminate Rx-band noise as the occurrence of desense is detected (for example, power is detected by the second power detector 830).

Referring to FIG. 13, in operation 1301, the processor 760 may adjust a power level of the power amplifier. For example, the processor 760 may perform an operation corresponding to operation 1209 described above with reference to FIG. 12.

The processor 760 may monitor the output power of the power amplifier in operation 1303, and may determine whether the power is detected in operation 1305. For example, the processor 760 may adjust the power of the power amplifier and may determine whether a voltage is detected by the second power detector 830. According to one embodiment, the processor 760 may adjust (for example, reduce) the power level of the power amplifier and may determine whether Rx-band noise is eliminated according to a voltage that is detected by the second power detector 830.

When the power is detected in operation 1305 (yes in operation 1305), the processor 760 may determine control information corresponding to the detected power in operation 1307. In operation 1309, the processor 760 may adjust the power level of the power amplifier based on the determined control information. For example, the processor 760 may perform operations corresponding to operation 1205, operation 1207, and operation 1209 described above with reference to FIG. 12.

When no power is detected in operation 1305 (no in operation 1305), the processor 760 may adjust the power level of the power amplifier based on the maximum output power of the power amplifier in operation 1311. For example, the power amplifier is mainly aimed at realizing maximum output power, not realizing maximum gain, and thus the processor 760 may control the power amplifier to amplify a transmitted signal according to a maximum output power point to output the transmitted signal. According to various embodiments, the processor 760 may control the output power of the power amplifier when a certain level of voltage is detected by the second power detector 830 (for example, in the occurrence of desense). Subsequently, when the certain level of voltage is not detected by the second power detector 830 (for example, when desense is eliminated), the processor 760 may change the changed output power of the power amplifier again to have maximum output power.

Figure 14:
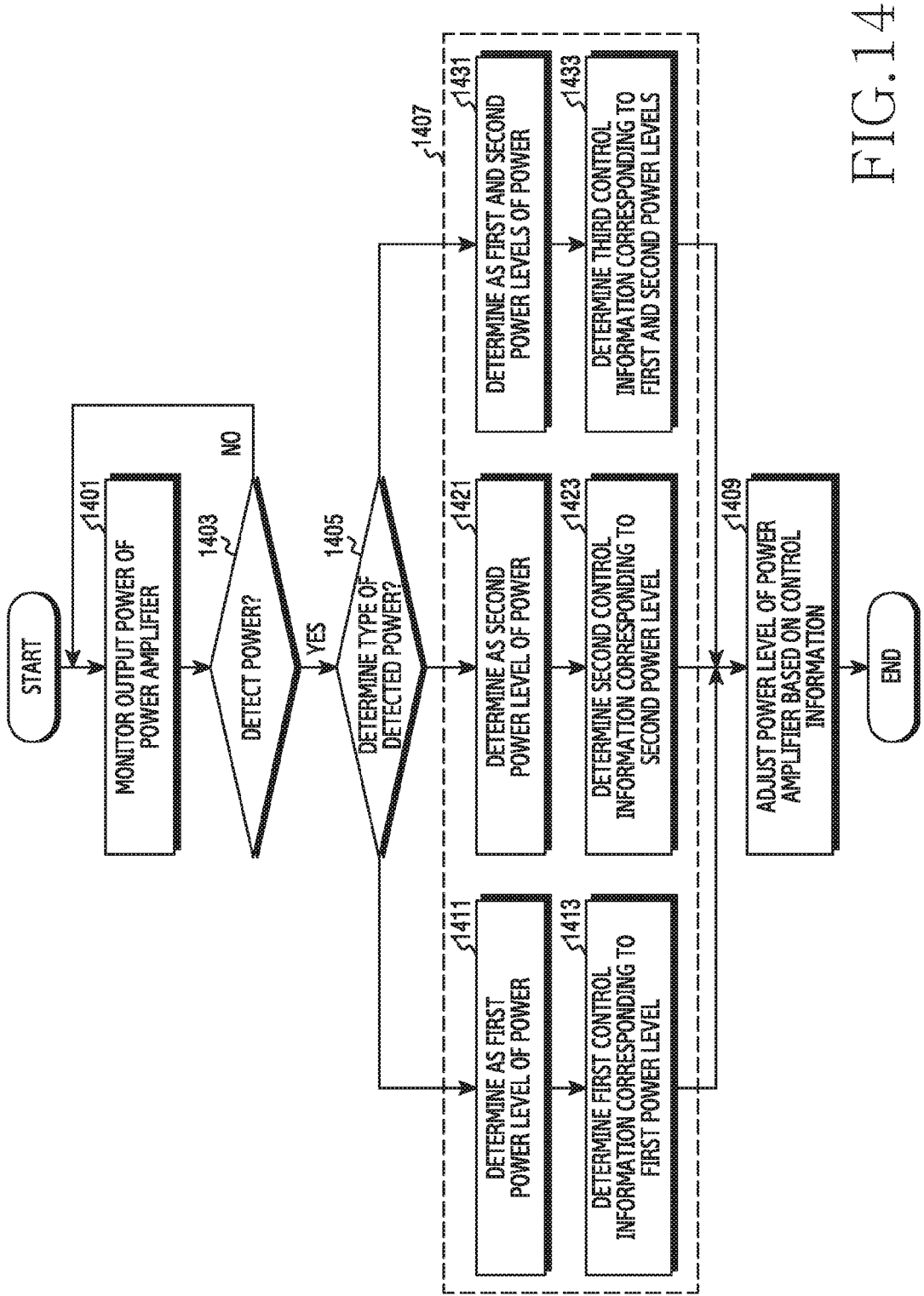
FIG. 14 is a flowchart illustrating an operation in which an electronic device controls an output power of a power amplifier according to various embodiments of the present disclosure.

FIG. 14 is a flowchart illustrating an operation in which an electronic device controls the output power of a power amplifier according to various embodiments of the present disclosure.

Referring to FIG. 14, the processor 760 may monitor the output power of the power amplifier in operation 1401, and may determine whether the power is detected in operation 1403. For example, the processor 760 may determine whether a voltage detected by at least one of the power detectors (for example, the first power detector 770 and the noise detector 780 (for example, the second power detector 830)) is received.

When no power is detected in operation 1403 (no in operation 1403), the processor 760 may go to operation 1401 and may perform operation 1401 and subsequent operations.

When the power is detected in operation 1403 (yes in operation 1403), the processor 760 may determine the type of the detected power in operation 1405. For example, the processor 760 may determine whether the detected power is from the first power detector 770, the second power detector 830, or both of the first power detector 770 and the second power detector 830. The processor 760 may identify, based on a determination result, whether the detected power is a first power level of power, a second power level of power, or a third power level (for example, first power level and second level) of power.

In operation 1407, the processor 760 may determine control information corresponding to the type of the detected power based on a result of determining the type of the detected power in operation 1405.

According to one embodiment, when it is determined that the detected power is power received from the first power detector 770 in operation 1405, the processor 760 may determine that the detected power has a first RF power level by the first power detector 770 in operation 1411. In operation 1413, the processor 760 may determine first control information corresponding to the first RF power level based on a mapping table related to the first RF power level by the first power detector 770.

According to one embodiment, when it is determined that the detected power is power received from the second power detector 830 in operation 1405, the processor 760 may determine that the detected power has a second RF power level by the second power detector 830 in operation 1421. In operation 1423, the processor 760 may determine second control information corresponding to the second RF power level based on a mapping table related to the second RF power level by the second power detector 830.

According to one embodiment, when it is determined that the detected power is power received together (for example, simultaneously or sequentially) from the first power detector 770 and the second power detector 830 in operation 1405, the processor 760 may determine that the detected power has a plurality of power levels (hereinafter, a third power level) including the first RF power level by the first power detector 770 and the second RF power level by the second power detector 830 in operation 1431. In operation 1433, the processor 760 may determine third control information based on a method set for the first RF power level and the second RF power level. For example, when the first RF power level and the second RF power level are detected together (for example, simultaneously or sequentially), the processor 760 may determine the third control information preferentially considering the second RF power level, disregarding the first RF power level. For another example, when the first RF power level and the second RF power level are detected together (for example, simultaneously or sequentially), the processor 760 may determine the first control information based on the first RF power level as the third control information having a lower value than the second control information based on the second RF power level by considering the second control information.

In operation 1409, the processor 760 may operate to adjust a power level of the power amplifier based on the determined control information (for example, the first control information, the second control information, or the third control information). According to one embodiment, as described above with reference to FIG. 10, the processor 760 may directly control the output power of the power amplifier based on the control information. According to another embodiment, as described above with reference to FIG. 11, the processor 760 may indirectly control the output power of the power amplifier through the control circuit 790 based on the control information.

Figure 15:
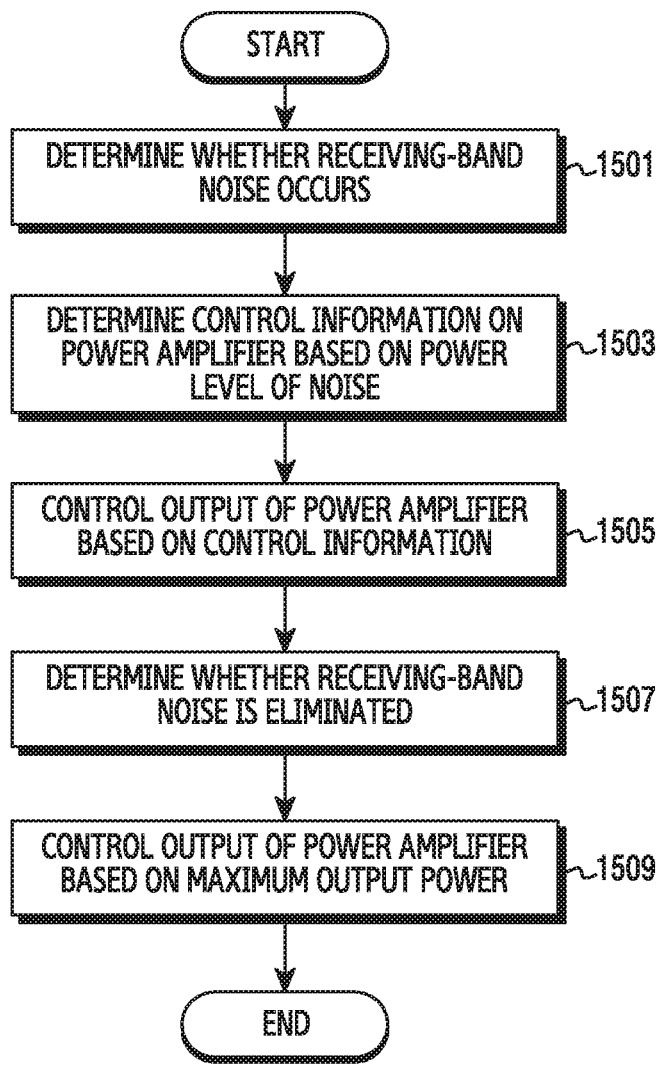
FIG. 15 is a flowchart illustrating a method for improving signal quality in an electronic device according to various embodiments of the present disclosure.

FIG. 15 is a flowchart illustrating a method for improving signal quality in an electronic device according to various embodiments of the present disclosure.

Referring to FIG. 15, in operation 1501, the processor 760 may determine whether receiving-band noise occurs. For example, when a certain level of voltage is detected by the noise detector 780 (or the second power detector 830), the processor 760 may determine that receiving-band noise (for example, desense) occurs by an output from the PAM 751.

In operation 1503, the processor 760 may determine control information on a power amplifier corresponding to a power level of the noise. For example, when the receiving-band noise is detected, the processor 760 may determine a bias (for example, control voltage or control current) of the power amplifier based on the power level of the noise.

In operation 1505, the processor 760 may control the output of the power amplifier based on the determined control information. For example, the processor 760 may operate to control the output of the power amplifier in the same manner as described above with reference to FIG. 13.

In operation 1507, the processor 760 may determine whether the receiving-band noise is eliminated. For example, the processor 760 may adjust the power of the power amplifier and may determine whether a voltage is detected by the second power detector 830. According to one embodiment, when the processor 760 adjusts (for example, reduces) the power level of the power amplifier, after which no voltage is detected by the second power detector 830, the processor 760 may determine that the receiving-band noise is eliminated.

In operation 1509, the processor 760 may control the output of the power amplifier based on the maximum output power of the power amplifier. For example, the processor 760 may control the power amplifier to amplify a transmitted signal according to a maximum output power point to output the transmitted signal. According to various embodiments, the processor 760 may control the output power of the power amplifier when the certain level of voltage is detected by the second power detector 830 (for example, in the occurrence of desense). Subsequently, when the certain level of voltage is not detected by the second power detector 830 (for example, when desense is eliminated), the processor 760 may change the changed output power of the power amplifier again to have maximum output power.

As described above, an operating method of an electronic device according to various embodiments of the present disclosure may include: detecting noise in a receiving band by a power amplifier; acquiring a power level of the noise; acquiring control information to change output power of the power amplifier based on the power level of the noise; and controlling the output power of the power amplifier based on the control information.

According to various embodiments, the detecting may include filtering the noise in the receiving band from an input from the power amplifier and detecting the power level of the noise from the noise in the receiving band that is filtered According to various embodiments, the filtering of the noise may include eliminating a signal other than the noise in the receiving band among the input from the power amplifier and to pass only the noise in the receiving band that is a set band among the input.

According to various embodiments, the detecting of the noise may include determining whether desense occurs by the noise in the receiving band in response to whether a second power level is detected by a noise detector.

According to various embodiments, the controlling of the output power may include performing power control based on first control information on a first power level in response to a detection of the first power level by a power detector, and performing power control for eliminating the noise based on second control information on the second power level in response to a detection of the second power level by the noise detector.

According to various embodiments, the controlling of the output power may include performing power control based on a preset processing method in response to a detection of the first power level by the power detector and a detection of the second power level by the noise detector.

According to various embodiments, the performing of the power control may include performing power control preferentially considering the second power level.

According to various embodiments, the performing of the power control may include determining first control information on the first power level as third control information having a lower value than second control information on the second power level by considering the second control information.

According to various embodiments, the controlling of the output power may include controlling the output power of the power amplifier, and changing the changed output power of the power amplifier to have maximum output power when the power level of the noise is not detected.

According to various embodiments, the controlling of the output power may include directly controlling an output of the power amplifier or indirectly controlling an output of the power amplifier through a control circuit configured to change the output of the power amplifier.

According to an electronic device and an operating method thereof according to various embodiments, the electronic device may adaptively detect the occurrence of desense in a receiving circuit. According to various embodiments, when the noise is detected in the receiving circuit, the electronic device may control the output of a power amplifier corresponding to a power level of the noise, thereby achieving noise elimination and power control at the same time. According to various embodiments, signal quality may be improved by eliminating receiving-band (Rx-band) noise, and when the circuit is stabilized by noise elimination, the changed output of the power amplifier may be maintained with maximum output power.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a power amplifier configured to amplify and output a transmitted signal;
   a noise detector configured to detect a noise in a receiving band and to output a power level of the noise, the noise detector comprising:
     a filter configured to:
       eliminate a signal other than the noise in the receiving band which is a set band among an input which is transmitted from the power amplifier, and
       pass, to a first power detector, the noise in the receiving band among the input, the first power detector configured to detect, based on the noise that is passed through the filter, the power level of the noise in the receiving band;
   a second power detector configured to detect a power level of the power amplifier to control an output power of the power amplifier; and
   at least one processor configured to:
     acquire the power level of the noise from the noise detector,
     acquire the power level of the power amplifier from the second power detector,
     determine, based on the power level of the noise and the power level of the power amplifier, control information to change output power of the power amplifier, and
     control, based on the control information, the output power of the power amplifier.

2. The electronic device of claim 1, wherein the noise detector further comprises a divider configured to distribute the input which is transmitted from the power amplifier to the filter and the second power detector.

3. The electronic device of claim 1, wherein the filter comprises a band pass filter for detecting the noise in the receiving band from the input which is transmitted from the power amplifier.

4. The electronic device of claim 2, wherein the at least one processor is further configured to determine whether desense occurs by the noise in the receiving band in response to whether the power level of the noise is detected by the noise detector.

5. The electronic device of claim 1, wherein the at least one processor is further configured to:
change, based on the control information, a bias of the power amplifier, and
control the output power of the power amplifier.

6. The electronic device of claim 1, wherein the at least one processor is configured to control, based on a preset processing method, the output power of the power amplifier in response to acquiring the power level of the noise and acquiring the power level of the power amplifier.

7. The electronic device of claim 1, wherein the at least one processor is configured to control the output power of the power amplifier preferentially considering the power level of the noise.

8. The electronic device of claim 1, wherein the at least one processor is configured to determine first control information on the power level of the power amplifier as third control information having a lower value than second control information on the power level of the noise.

9. The electronic device of claim 1, wherein the at least one processor is further configured to
change changed output power of the power amplifier to have maximum output power when the power level of the noise is not detected by the noise detector.

10. The electronic device of claim 1, further comprising:
a control circuit configured to change an output of the power amplifier,
wherein the control circuit comprises at least one of an antenna tuner or a matching circuit.

11. An operating method of an electronic device, the operating method comprising:
eliminating, by a filter of a noise detector of the electronic device, a signal other than a noise in a receiving band among an input which is transmitted from a power amplifier;
passing, by the filter, to a first power detector, the noise in the receiving band that is a set band among the input;
acquiring, by a processor of the electronic device, a power level of the noise via the first power detector which detects, based on the noise that is passed through the filter, the power level of the noise in the receiving band;
acquiring, by the processor, a power level of the power amplifier via a second power detector which detects the power level of the power amplifier to control an output power of the power amplifier;
determining, by the processor, control information to change the output power of the power amplifier, based on the power level of the noise and the power level of the power amplifier; and
controlling, by the processor, the output power of the power amplifier, based on the control information.

12. The method of claim 11, further comprising determining whether desense occurs by the noise in the receiving band in response to whether the power level of the noise is detected by the noise detector.

13. The method of claim 11, wherein the filter comprises a band pass filter for detecting the noise in the receiving band from the input which is transmitted from the power amplifier.

14. The method of claim 11, wherein determining, based on the power level of the noise and the power level of the power amplifier, the control information to change the output power of the power amplifier comprises determining the control information to change the output power of the power amplifier preferentially based on the power level of the noise.

15. The method of claim 11, wherein determining, based on the power level of the noise and the power level of the power amplifier, the control information to change the output power of the power amplifier comprises determining first control information on the power level of the power amplifier as third control information having a lower value than second control information on the power level of the noise.

16. The method of claim 11, further comprising changing the output power of the power amplifier to have maximum output power when the power level of the noise is not detected by the noise detector.

17. The method of claim 11, wherein the controlling the output power of the power amplifier comprises directly controlling the output power of the power amplifier or indirectly controlling the output power of the power amplifier through a control circuit configured to change the output power of the power amplifier.

* * * * *